(12) United States Patent
Withey et al.

(10) Patent No.: US 10,974,459 B2
(45) Date of Patent: Apr. 13, 2021

(54) PARALLEL METHOD OF FLOOD FILLING, AND APPARATUS

(71) Applicant: Sony Interactive Entertainment Inc., Tokyo (JP)

(72) Inventors: Robert Keith John Withey, Biggleswade (GB); Andrew James Bigos, Stains-upon-Thames (GB)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 16/520,394

(22) Filed: Jul. 24, 2019

(65) Prior Publication Data

US 2020/0031058 A1   Jan. 30, 2020

(30) Foreign Application Priority Data

Jul. 27, 2018   (GB) ..................................... 1812271

(51) Int. Cl.
   *B29C 64/393* (2017.01)
   *G06T 15/80* (2011.01)
   (Continued)

(52) U.S. Cl.
   CPC ............ *B29C 64/393* (2017.08); *G06F 30/00* (2020.01); *G06T 15/80* (2013.01); *G06T 17/005* (2013.01); *B33Y 50/02* (2014.12)

(58) Field of Classification Search
   None
   See application file for complete search history.

(56) References Cited

U.S. PATENT DOCUMENTS

2014/0043331 A1   2/2014   Makinen
2016/0092777 A1   3/2016   Austin
(Continued)

FOREIGN PATENT DOCUMENTS

WO   2004006181 A2   1/2004

OTHER PUBLICATIONS

Vuckovic et al.; "Generalized N-way iterative scanline fill algorithm for real-time Applications;" Journal of Real-Time Image Processing (2019) Published online: Nov. 6, 2017; Springer; pp. 2213-2231 (Year: 2017).*

(Continued)

*Primary Examiner* — Edward Martello
(74) *Attorney, Agent, or Firm* — Matthew B. Dernier, Esq.

(57) ABSTRACT

A flood-fill method for parallel implementation includes the steps of receiving an image including first elements having a flood fill source colour to be replaced with a flood fill target colour, and second elements not having the flood fill source colour; dividing the image according to a hierarchical space-partitioning scheme to form cells at a plurality of levels in the hierarchy; detecting the occupancy of each cell by second elements; for any cell having no occupancy by second elements, set a depth elevation value for child cells of that cell to be one greater than the value for that cell, indicating that the flood fill shall navigate levels towards a root cell by the depth elevation amount of a cell whilst only occupying nodes without any second elements, thereby reaching the largest parent cell which can be flood-filled; and filling the flood fill source colour of cells having no occupancy by second elements with the flood fill target colour, thereby modifying the received image.

16 Claims, 20 Drawing Sheets

(51) Int. Cl.
    *G06T 17/00*     (2006.01)
    *G06F 30/00*     (2020.01)
    *B33Y 50/02*     (2015.01)

(56) References Cited

U.S. PATENT DOCUMENTS

2016/0200042 A1*   7/2016   Jeng .................... B33Y 50/00
    264/401
2017/0109922 A1     4/2017   Kulon

OTHER PUBLICATIONS

Combined Search and Examination Report for corresponding GB Application No. 1812271.3, 2 pages, dated Jan. 28, 2019.
The Extended European Search Report for corresponding EP Application No. 19169944.6, 9 pages, dated Feb. 14, 2020.
Vladan Vuckovic, et al., "Generalize N-way iterative scanline fill algorithm for real-time applications" Journal of Real-Time Image Processing. vol. 16, pp. 2213-2231, Nov. 6, 2017.

* cited by examiner

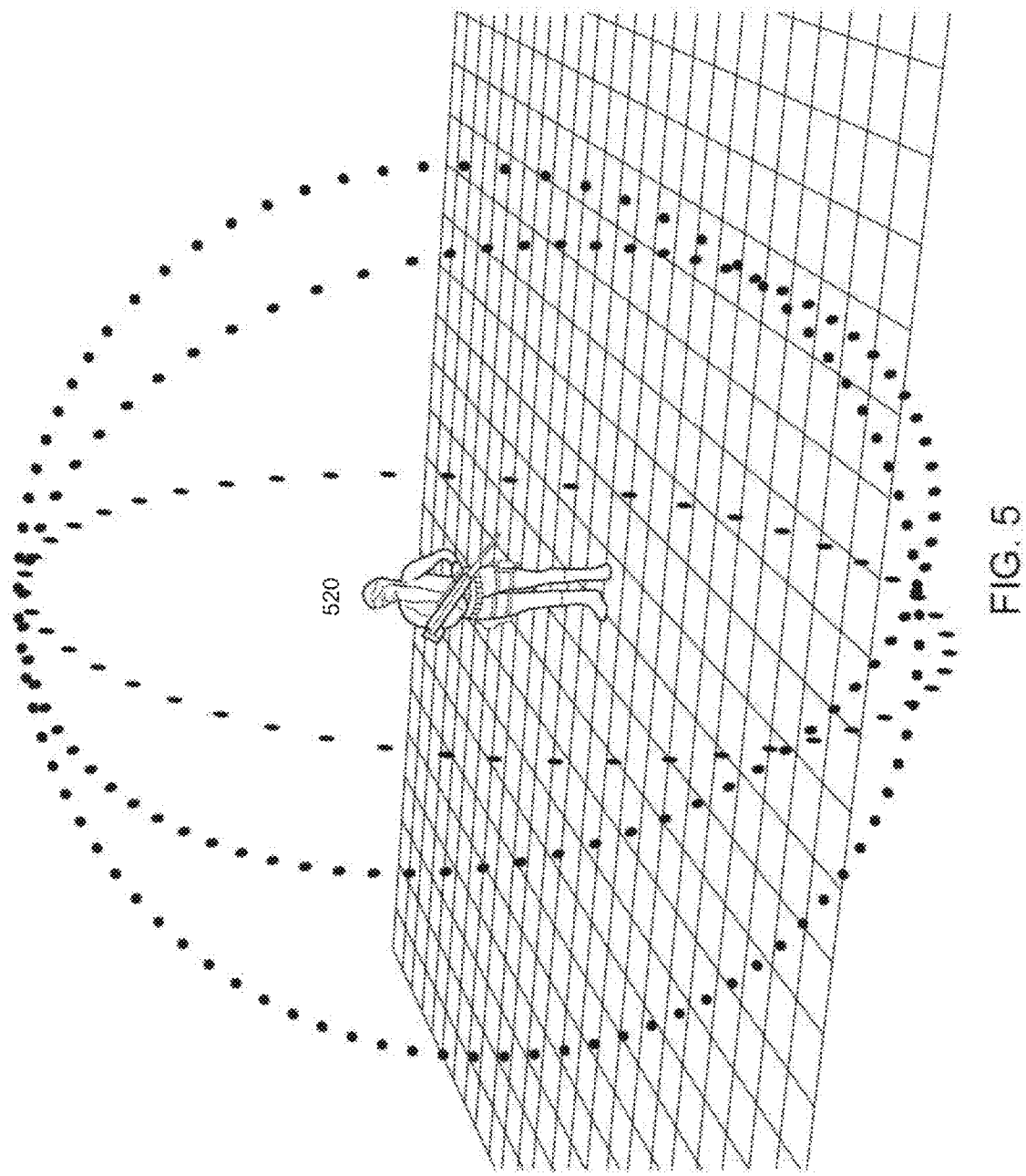

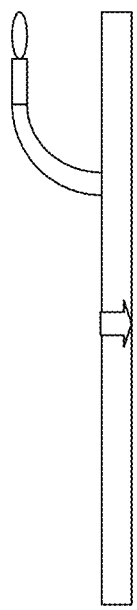
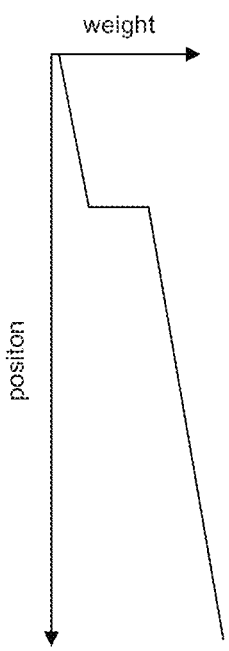
Figure 10A    Figure 10B    Figure 10C
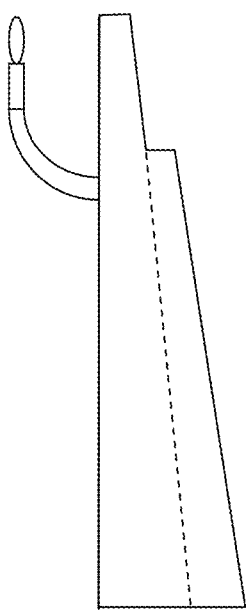
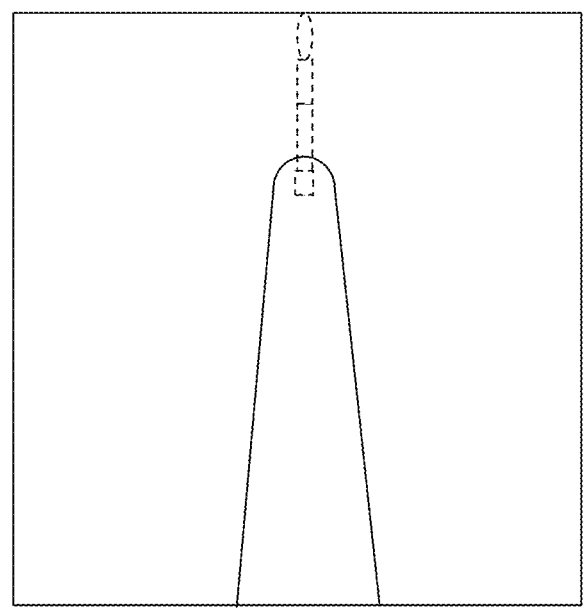
Figure 10D    Figure 10E

US 10,974,459 B2

PARALLEL METHOD OF FLOOD FILLING, AND APPARATUS

This application claims the benefit of patent application GB 1812271.3, filed Jul. 27, 2018, the entire disclosure of which is hereby incorporated by reference.

BACKGROUND OF THE INVENTION

Field of the Invention

The present invention relates to a parallel method of flood filling and a corresponding apparatus.

Description of the Prior Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

3D printing is a means of volumetric printing, where instead of depositing two-dimensional pixels on a flat surface, the printer deposits three-dimensional voxels within a volume. There are numerous technologies to achieve this, including the use of lasers to melt and fuse materials such as metal powder in incremental layers to build a structure, or the use of a high-temperature print-head to deposit small droplets of plastic that cool and harden to build up a 3D model.

The design for such a 3D model is typically generated in a computer-aided design program, in which a user defines surfaces and volumes of a virtual model. A drawing list is then generated by the program specifying the order in which to fuse or deposit materials to render the virtual model using the 3D printer.

This approach has resulted in the creation of many aesthetically and functionally unique objects, some of which are difficult to make using conventional processes. However the utility of 3D printers has still not been fully explored.

The present invention aims to provide a new use for 3D printers.

SUMMARY OF THE INVENTION

It is to be understood that both the foregoing general description of the invention and the following detailed description are exemplary, but are not restrictive, of the invention.

In a first aspect, a flood-fill method for parallel implementation is provided in accordance with claim 1.

In another aspect, an entertainment device is provided in accordance with claim 16.

Further respective aspects and features of the invention are defined in the appended claims.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 5 is a schematic diagram of default virtual camera positions for a virtual photogrammetry process in accordance with embodiments of the present invention.

FIGS. 10 A-E are schematic diagrams illustrating a process of generating geometry for 3D printing in accordance with embodiments of the present invention.

DESCRIPTION OF THE EMBODIMENTS

A system and method of flood-filling for a parallel implementation are disclosed. In the following description, a number of specific details are presented in order to provide a thorough understanding of the embodiments of the present invention. It will be apparent, however, to a person skilled in the art that these specific details need not be employed to practice the present invention. Conversely, specific details known to the person skilled in the art are omitted for the purposes of clarity where appropriate.

In an embodiment of the present invention, an entertainment device is operably coupled to a 3D printer. The entertainment device is arranged in operation to capture snapshots of videogame play for replication by the 3D printer, as explained later herein.

Entertainment Device

An example of a suitable entertainment device is the Sony® PlayStation 4® device.

Figure 1:
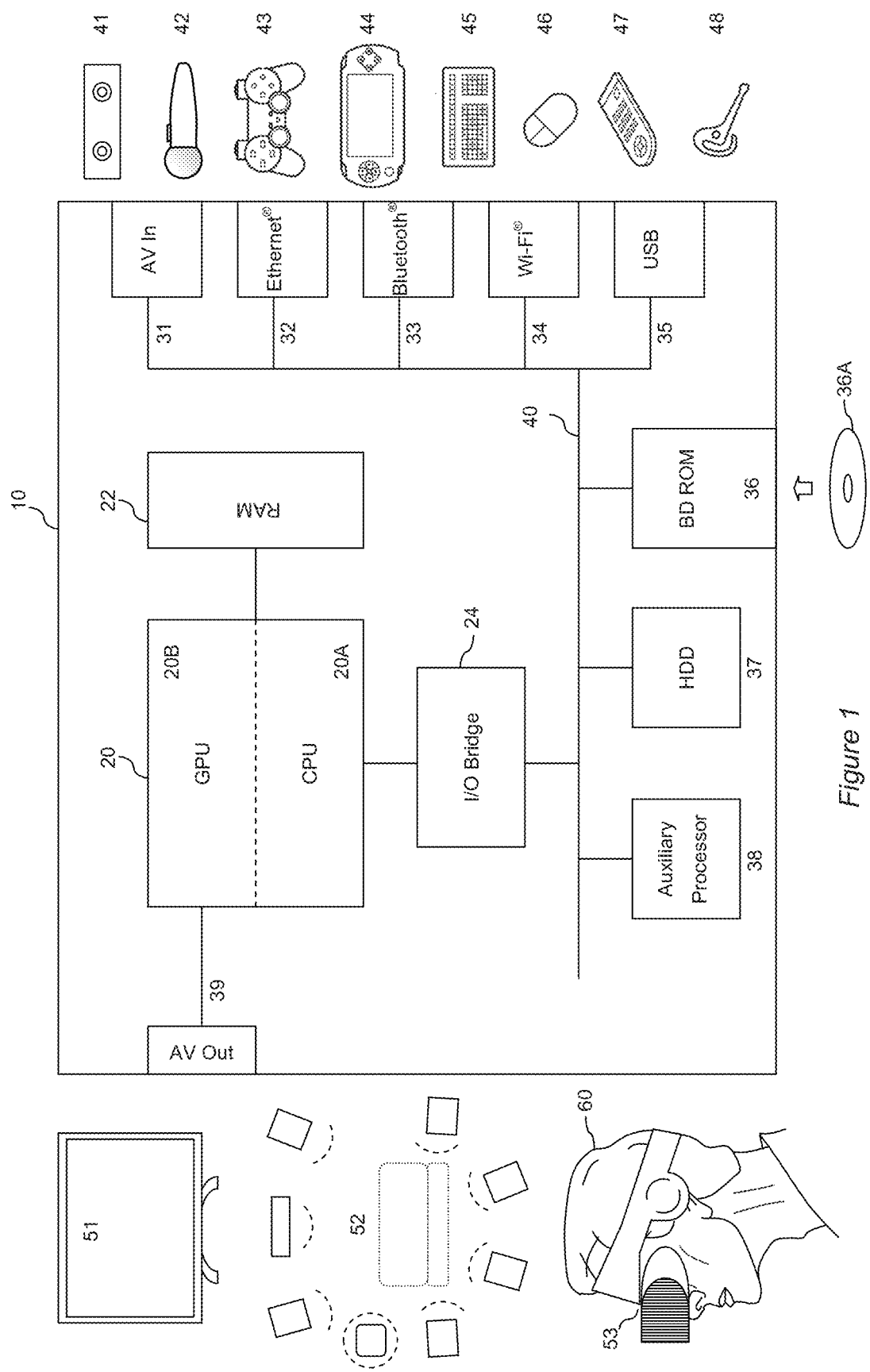
FIG. 1 is a schematic diagram of an entertainment device in accordance with embodiments of the present invention.

FIG. 1 schematically illustrates the overall system architecture of the Sony® PlayStation 4@ entertainment device. A system unit 10 is provided, with various peripheral devices connectable to the system unit.

The system unit 10 comprises an accelerated processing unit (APU) 20 being a single chip that in turn comprises a central processing unit (CPU) 20A and a graphics processing unit (GPU) 20B. The GPU is capable of implementing multiple work products in parallel. The APU 20 has access to a random access memory (RAM) unit 22.

The APU 20 communicates with a bus 40, optionally via an I/O bridge 24, which may be a discreet component or part of the APU 20.

Connected to the bus 40 are data storage components such as a hard disk drive 37, and a Blu-ray® drive 36 operable to access data on compatible optical discs 36A. Additionally the RAM unit 22 may communicate with the bus 40.

Optionally also connected to the bus 40 is an auxiliary processor 38. The auxiliary processor 38 may be provided to run or support the operating system.

The system unit 10 communicates with peripheral devices as appropriate via an audio/visual input port 31, an Ethernet® port 32, a Bluetooth® wireless link 33, a Wi-Fi® wireless link 34, or one or more universal serial bus (USB) ports 35. Audio and video may be output via an AV output port 39, such as an HDMI port.

The peripheral devices may include a monoscopic or stereoscopic video camera 41 such as the PlayStation Eye® or PS Camera®; wand-style videogame controllers 42 such as the PlayStation Move® and conventional handheld videogame controllers 43 such as the DualShock 4®; portable entertainment devices 44 such as the PlayStation Portable® and PlayStation Vita®; a keyboard 45 and/or a mouse 46; a media controller 47, for example in the form of a remote control; and a headset 48. Other peripheral devices may similarly be considered such as a phone or tablet, printer, or a 3D printer (not shown).

The GPU 20B, optionally in conjunction with the CPU 20A, generates video images and audio for output via the AV output 39. Optionally the audio may be generated in conjunction with or instead by an audio processor (not shown).

The video and optionally the audio may be presented to a television 51. Where supported by the television, the video may be stereoscopic. The audio may be presented to a home cinema system 52 in one of a number of formats such as stereo, 5.1 surround sound or 7.1 surround sound. Video and audio may likewise be presented to a head mounted display unit 53 worn by a user 60. The head mounted display unit may have integral headphones, attachable headphones/earbuds, or rely on separate audio being supplied to the user.

In operation, the entertainment device defaults to an operating system such as a variant of FreeBSD 9.0. The operating system may run on the CPU 20A, the auxiliary processor 38, or a mixture of the two. The operating system provides the user with a graphical user interface such as the PlayStation Dynamic Menu. The menu allows the user to access operating system features and to select games and optionally other content.

3D Printer

As was noted previously, the entertainment device is operably coupled to a 3D printer.

It will be appreciated that there are numerous technologies for 3D printing that are typically differentiated by how layers are built up to create a model. One technology is known as selective laser sintering (SLS), where a layer of powder is selectively fused together by a laser to create solid regions; a new layer of powder is then placed on top and the process repeats to build the model. Another technology is known as stereolithography, and uses a photo-reactive liquid in conjunction with one or more lasers to harden the liquid at defined points, thereby building the model, again typically in layers. Whilst both of these techniques are envisaged within the scope of embodiments of the present invention, they have the disadvantage of requiring both powerful lasers and large volumes of matrix material in the form of powder or liquid around the model, which make them less practical for domestic use. Consequently a preferred technology is fused deposition modelling (FDM). This approach melts plastic in a printer head that moves over successive layers of the model, depositing droplets of plastic at selective positions in each layer in a manner similar to the deposition of droplets of ink by an inkjet printer on a sheet of paper. This avoids the need for lasers or a surrounding matrix of the raw material used by the model. Accordingly for the purposes of understanding an FDM 3D printer is briefly described herein with reference to FIGS. 2A and 2B.

Figure 2A:
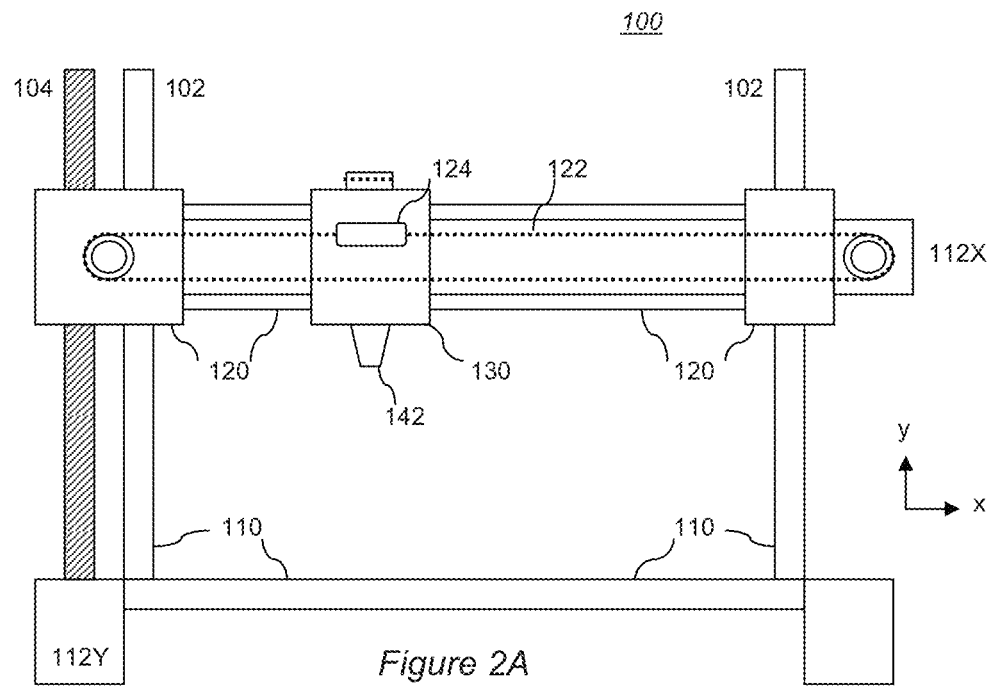
FIG. 2A is schematic diagram of a side elevation of a 3D printer in accordance with embodiments of the present invention.
Figure 2B:
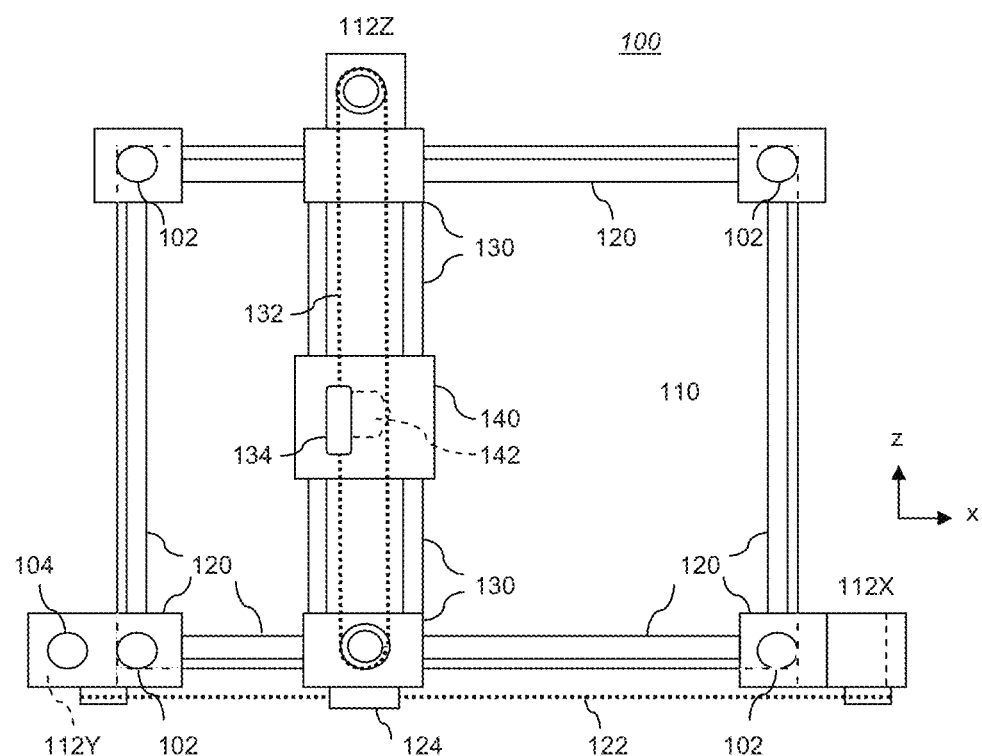
FIG. 2B is schematic diagram of a plan view of a 3D printer in accordance with embodiments of the present invention.

FIG. 2A shows a side elevation of a simple FDM 3D printer 100, whilst FIG. 2B shows a plan view of the same FDM 3D printer. The printer 100 comprises a base structure 110 that provides a working surface for assembly of the printed model and support struts 102 upon which a printer frame 120 can be raised and lowered.

In an example mechanism, a motor 112Y is coupled to a drive bar 104 comprising a screw thread; a printer frame 120 then comprises a coupling section with a threaded hole and a smooth hole, the threaded hole being engaged with the drive bar and the smooth hole being engaged with one of the support struts. When, under instruction from a printer driver, the motor 112Y turns the drive bar in a clockwise or anticlockwise direction, the printer frame is moved up or down the drive bar and support strut (i.e. along the y-axis) and hence raises or lowers a printer carriage 130 attached to it.

As can be seen from FIG. 2B, the printer frame 120 is typically mounted on four support struts 102. Optionally a second motor, drive bar and coupling section may be provided at an opposing corner of the frame, to reduce strain on the frame and the motor.

The printer frame 120 supports the printer carriage 130. A motor 112X is coupled to a drive band 122 that is fixed by fixing means 124 to the printer carriage 130. When, under instruction from a printer driver, the motor 112X rotates the drive band clockwise or anticlockwise, the printer carriage 130 is moved right or left along the printer frame 120 (i.e. along the x-axis) and hence moves an attached printer mechanism 140 laterally.

The printer carriage 130 supports the printer mechanism 140. A motor 112Z is coupled to a drive band 132 that is fixed by fixing means 134 to the printer mechanism 140. When, under instruction from a printer driver, the motor 112Z rotates the drive band clockwise or anticlockwise, the printer mechanism 140 is moved in or out of a depth direction (i.e. along the z-axis).

The printer mechanism 140 itself comprises heating means for heating the end of one or more plastic threads fed into the mechanism (not shown), or for heating grains of plastic powder obtained from a hopper on the mechanism (not shown). The heating of the plastic or alternatively the release of heated plastic is controlled by instruction from a printer driver. A resulting bead or droplet of melted plastic is then deposited onto the working surface 110 of the printer or a partially built model (not shown) as applicable, through the printer head or nozzle 142.

In this way, under suitable instruction from a printer driver, the printer head can be positioned anywhere within a working volume of the 3D printer using motors 112X, Y, Z, and a droplet of plastic can be deposited at that position, which then cools and hardens to form a voxel of a 3D model. Through successive movement of the printer head and selective melting or release of plastic droplets, a completed 3D model can thus be built from a plurality of such voxels.

Typically the printer driver itself is a software module in a computer-aided design system that receives model geometry describing the 3D model. The printer driver then generates thin slices of the 3D model one voxel thick for each layer in the y direction, and determines the x, z coordinates for each voxel in that layer. The printer driver then outputs a sequence of instructions to the printer 100 to move the printer head 142 to the respective x, z coordinate for each voxel in layer y, where the printer mechanism is instructed to heat and/or release a droplet of plastic to form a voxel at that position. In this way the digital 3D model is rebuilt as a physical model by the 3D printer.

In an embodiment of the present invention, the printer driver is incorporated into the videogame, or the operating system of the entertainment device, or a middleware library of support functions used by either the videogame or the operating system.

Virtual Environment

Figure 3:
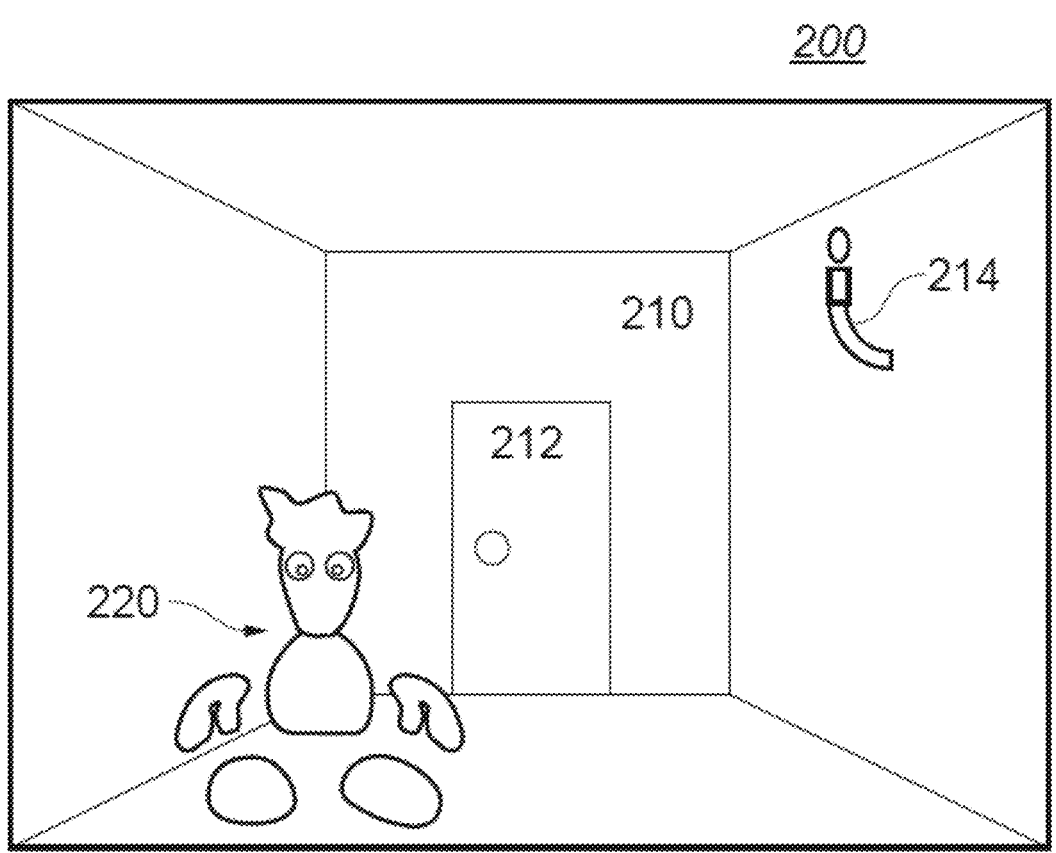
FIG. 3 is a schematic diagram of a videogame virtual environment in accordance with embodiments of the present invention.

Referring now to FIG. 3, a videogame running on the entertainment device comprises a virtual environment in which typically a plurality of entities or environmental elements are dynamically viewed as the user changes the position of viewpoint and as entities or elements of the game enact scripted activities or react to the user's behaviour, or a mixture of both.

In FIG. 3, a simple environment 200 is illustrated comprising a room 210 with a door 212; on one wall there is mounted a candle in a candleholder 214. In the room is the player's character 220 (here illustrated for example by the fictitious game character Blobman).

The virtual environment is constructed in 3D from geometry data, typically in the form of polygons defining a surface of an object. These polygons may be predefined for example in the case of static objects and background scenery, or may be warped/repositioned or procedurally generated in the case of mobile entities within the environment such as the player's character. It will be appreciated that references herein to 'polygons' encompasses preliminary geometrical features such as vertices, from which polygons are built, where these are used in the graphics pipeline. Similarly, voxel rendering uses equivalent geometric features to describe objects. Hence processes described as applying to polygons may be applied in whole or part to such other geometrical features as appropriate.

The virtual environment is then prepared for presentation to the user from a selected viewpoint. Elements of the environment that have line of sight to the user are patterned with texture information appropriate to the object they represent, and the textured geometry is further processed for lighting effects, such as variations in brightness from virtual light sources, and bump mapping (or similar techniques such as displacement mapping or use of an isosurface) to simulate how the texture should interact with such a virtual light source. Additionally other effects such as volumetric fog and particle effects may be included.

The final rendered image is then presented to the user, typically via a 2D or 3D television or via a head mounted display.

Often within such games, the user has an experience that they wish to share with friends and/or the wider world. To this end, as noted previously an entertainment device such as the PlayStation 4® can have a 'share' button on its controller to facilitate a capture of the image presented to the user, which can then be uploaded to a sharing site such as a social media site.

Printing a 3D Model of the Environment from a Collection of Images

In an embodiment of the present invention, the user is provided with the option to select a moment within the game from which to create a 3D printed model. In this way, the user can create tangible mementos of their in-game experiences.

In an embodiment of the present invention, when the entertainment device receives an input indicating that a user wishes to create a 3D print of the current scene, the game state is frozen (e.g. paused) so that it can be analysed for 3D printing.

It will be appreciated that for a game, many visible features are not inherent in the in-game geometry or textures of a model alone. For example the in-game geometry, which may be a mix of polygons and skeletal models, may have physics effects such as positioning and deformation applied from frame to frame. Other rendering effects like procedural effects and parametrised models may be done in shaders during rendering. Meanwhile shaders may also visually process textures according to bump maps and the like. Consequently often the final scene—as viewed by the user—is only combined in one place, and in one format, when it is rendered for display on screen.

Consequently, in an embodiment of the present invention, a 3D model is constructed for 3D printing using these rendered images in preference to the potentially disparate internal in-game representations of the virtual environment geometry. Such a technique may be referred to as virtual photogrammetry. However, a single rendered image will typically comprise insufficient information to fully model the virtual environment for 3D printing.

As was noted previously herein, during normal play the virtual environment is rendered for a particular viewpoint. Furthermore to enable high frame rates and efficient processing, then as part of this rendering process elements of the environment that are not visible from that particular viewpoint are culled early in the rendering process.

Consequently only the elements of the environment visible from the selected viewpoint are preserved and rendered. If one were to generate a 3D printer model of the environment using this render, then all aspects of the model that were not visible from that particular viewpoint would be missing or would have to be filled in using some form of interpolation algorithm. Clearly this would give rise to unsatisfactory results when the real printed model was viewed from any other angle.

Accordingly, in an embodiment of the present invention, while the game state is frozen the entertainment device generates a plurality of rendered images of the virtual environment from different viewpoints.

Preferably at least two opposing viewpoints are rendered, with the first viewpoint typically being the one originally displayed to the user. Between the two images, this results in the rendering of most if not all of the elements of the environment culled in the original rendered view.

Optionally three viewpoints are rendered, preferably equally distributed on a plane, with the first viewpoint being the one originally displayed to the user and the plane being horizontally centred on the direction of view of that first viewpoint. Again this results in the rendering of most if not all of the elements of the environment culled in the original rendered view, but is likely to capture more elements of the environment that may have been occluded by objects both in front and behind them and hence not rendered in either of the two viewpoints mentioned above.

More generally, as more viewpoints are distributed on the plane, fewer elements of the environment remain un-rendered. For example, the entertainment device may conduct a 'fly-by' within the environment, capturing N images, where N is for example between 2 and 360. The number of images captured is a trade-off between fidelity of the eventual model and the memory and processing capacity of the entertainment device needed to analyse the captured images (as discussed later herein).

Optionally, one or more viewpoints looking down from above the virtual environment may also be rendered (either as individual images or as part of a flyby sequence) to provide additional detail for those elements of the environment that are substantially parallel to the previously captured viewpoints on a single plane, such as the top surfaces of some environmental features.

In an embodiment of the present invention, metadata relating to the position and viewing direction of the virtual camera representing the viewpoint for each image is also recorded and associated with the respective image.

It will be appreciated that the virtual environment may represent a large area, whereas the 3D model will encompass a limited area determined by the size of models that can be generated by a particular 3D printer and the scale at which the environment is printed. Preferably the properties of the particular 3D printer are known if it is in communication with the entertainment device (otherwise, a default model size may be assumed or the user may stipulate a size); similarly the scale at which the environment is printed may be selected by the user or may be automatically determined with reference to a key character within the environment, such as the user's avatar. This avatar may be chosen to be a particular size within the final 3D printer model (as a non-limiting example, 5 cm tall by default), and the extent of the environment to be printed at the same scale may thus be calculated. Alternatively, in a 'character print' mode, only a particular character, such as the user's avatar, may be printed, without surrounding in-game environmental features. This may be of particular value for cases where the user is allowed to customise their own in-game character, and becomes emotionally attached to it.

The equidistant distribution of two or more viewpoints may thus be centred on this key character, and may optionally use any in-game camera control logic to determine the necessary direction of view needed to centre the key character within each captured image.

Where the game presents a first-person view, then based upon the model size and an assumed or user-set scale, the centre point of the model can be calculated and the viewpoints can be distributed around it.

Combining the above approaches, the entertainment device may capture images by selecting sample points on a sphere of predetermined radius, and which is centred on that centre point. Optionally those sample points that are occluded by an environmental barrier (such as a point on the sphere below the ground or inside a mountain) may either be skipped, or the radius of the sphere may be locally reduced until the surface is no longer occluded by the environmental barrier. Alternatively, elements of the environment that are not part of a target object that is to be 3D printed may be omitted from the render to provide an unobstructed view (selection of a target object from the wider virtual environment is described later herein). The sampling scheme may initially select viewpoints on the above mentioned plane comprising the original viewpoint and centre point and parallel to the horizontal axis of the original viewpoint, before optionally selecting one or more viewpoints on the sphere above this plane, and optionally one or more viewpoints on the sphere below this plane. The predetermined radius may be equal to the distance between the original viewpoint and the determined centre point of the model, to maintain consistency with the original captured image, or the original image and the subsequent additional image(s) may be re-rendered at a different effective radius, for example a minimum radius at which the field of view of the image encompasses the ground area that will be included in the 3D printed model. Notably, traditionally games use lower-fidelity models at greater draw distances to simplify the rendering process. Therefore optionally the radius may be constrained to a maximum distance equal to a rendering distance at which the game would select a lower-fidelity model of a key element of the image (such as the user's avatar). Further optionally, this may be overridden by a user for aesthetic purposes or because they wish to ensure that a particular environmental feature or combination of features is included in the final model. This may be of particular value for cases where the user is allowed to customise the environment, for example by creating so-called 'mods'.

In any event, the result is a set of images capturing two or more complimentary viewpoints of the virtual environment for a given game state.

It will be appreciated that the above image capture procedure may be controlled by the entertainment device. However, alternatively or in addition the user may capture images of the same scene from one or more different viewpoints by selecting these viewpoints themselves and using a conventional image capture process. These viewpoints may not correspond to the preferred distributions discussed previously herein. It will similarly be appreciated that images of the same scene from different viewpoints can be captured by different users at different times on different entertainment devices; providing a user has access to a pooled set of images (for example if they are posted to an online forum, or are stills extracted from a 'fly-by' video that moves or changes viewpoints, such as may be included in a trailer video for the videogame) then an equivalent set of two or more complementary viewpoints of the virtual environment may be obtained.

Given these images and optionally associated metadata relating to the viewpoint position and direction, an entertainment device can go on to analyse these images to generate 3D model data.

Several analysis techniques may be used, optionally in a complementary manner.

Silhouette analysis uses the edges of objects within the captured images to estimate the object's profile local to that edge. The object profile can then be extruded orthogonal to the profile for each viewpoint until it intersects with another extruded profile (typically extruded from another viewpoint), to create an approximation of the object's shape. It will be appreciated that as the number of viewpoints increases according to the scheme described previously herein, each extrusion will subtend a smaller angle around the object, resulting in a more accurate overall model of the object.

Stereoscopic analysis uses the relative displacement of the same objects within two overlapping viewpoints to calculate their distance from the or each viewpoint. From this information, a depth map can be constructed that is indicative of the 3D shape of the object in the region visible to both viewpoints. Hence again where more viewpoints are available, successive pairs of viewpoints can be used to build a map of the surface of a viewed object.

In either case, where there is no viewpoint information, this may be estimated by correlating environmental features between images, and selecting viewpoint positions and directions that provide the best correlation for the relative positions of these features.

It will be appreciated that silhouette analysis and stereoscopic analysis can be used to complement each other. For example the two techniques can be used to detect errors in each other's models; where the two techniques generate estimates of an object surface that differ by a threshold amount, the estimate that most closely matches an interpolation between nearby estimates of the object surface from the two techniques that are within a threshold agreement may be used, with the other estimate being discarded. Optionally, such areas of the model may also be highlighted for inspection and/or editing by the user prior to printing, as discussed later herein.

The above techniques are particularly useful where the image data is obtained from third parties (for example from screenshots on a forum), and there is no additional metadata available.

However, in the case of images generated and captured by the entertainment device, it is preferable to also capture associated depth information generated by the entertainment device itself. As was noted previously, during a conventional render of a viewpoint, elements of the environment that are occluded from the rendered view are culled. This occlusion is determined, at least in part, by the relative distance of objects in the environment from the virtual camera; for example objects that are behind other objects are deemed to be occluded and thus culled. These distances are calculated by the entertainment device for this purpose. This means that there is an accurate and per-pixel (or even sub-pixel) resolution distance or 'depth' map available for each captured image.

In an embodiment of the present invention, this depth map is also captured and associated with each image captured by the entertainment device for use in the generation of the 3D model. In principle, this information can be obtained in a manner that is transparent to the operation of the renderer by copying the so-called z-buffer used when generating the image. Consequently the image capture process does not require modification of a game rendering engine.

More generally, it will be appreciated that any suitable technique for identifying the surface position of a rendered pixel within each captured image can be made with respect to a 3D origin (or example an origin within the game world or an origin for the render of the target object in isolation), thereby generating a consistent representation of the pixel over potentially multiple renders.

Figure 4:
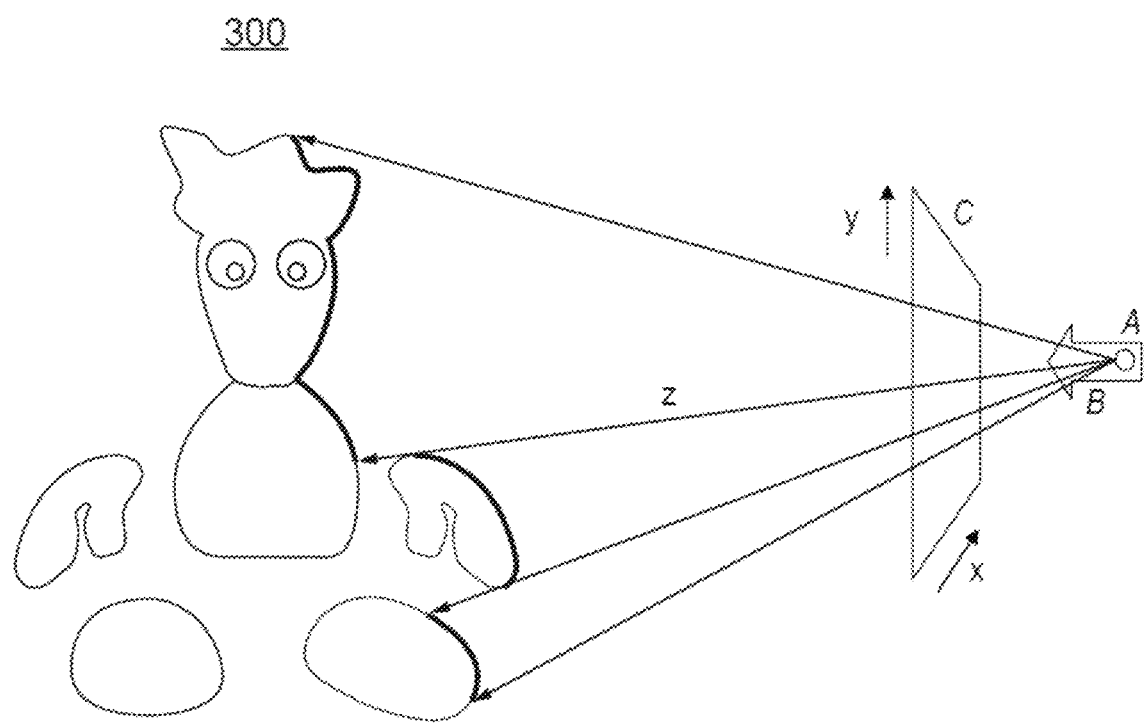
FIG. 4 is a schematic diagram of a projection in to a 3D model space in accordance with embodiments of the present invention.

Referring now to FIG. 4, given information regarding the position A and viewpoint direction B of each image, together with the associated distance information z, the pixels of each image can be projected to respective points within a shared virtual modelling space 300, for example based on a common origin. In effect, each pixel is displaced from the position A of the image viewpoint by amount x,y,z in a co-ordinate scheme local to the image (but which may be rotated to a co-ordinate scheme common to the shared virtual modelling space, using known techniques). Here, x and y are the pixel co-ordinates in the captured image (represented by notional screen C), and z is the associated depth or distance value for that pixel from the camera position A. Only one column of pixels (i.e. for a single value of x) have been projected in FIG. 4 for clarity, but it will be appreciated that any number of pixels of the image can be projected in this manner; for example, those corresponding to the target object.

The result is that pixels from each image will be positioned within the shared virtual modelling space at their correct position in 3D on the surface of a virtual object in the scene, as illustrated in FIG. 4 using the example of Blobman. As each image is projected into the shared virtual modelling space, more of the surface of each object in the scene will be 'painted-in' in this manner. Where two images project the same pixel onto the same point in 3D space, the second projected pixel may be discarded or may replace the first pixel, or an average value may be generated.

It will be appreciated that pixels are two dimensional objects. Consequently in an embodiment of the present invention, when a pixel from an image is projected to a position $x_i$, $y_j$, $z_k$ in the shared virtual modelling space, in fact a voxel (a typically cubic 3-dimensional pixel) is created at that position, and the colour information associated with the projected pixel is used as the colour information for the voxel.

The effect is that a shell of voxels representing the visible surface of the virtual environment is built up by projecting the colour data of the image pixels in each image to x,y,z positions in the shared virtual modelling space.

It will be appreciated that instead of projecting plural images into a shared modelling space using the z-buffer depth information from the entertainment device, this depth information may be estimated using the previously discussed techniques of stereoscopic depth estimation and/or silhouette analysis and surface extrusion. Hence these techniques may also be used to drive the assembly of a voxel shell within a shared model space in the above described manner.

In any event, once all the images have been used, the resulting shell of voxels can be analysed for integrity. Any gaps in a surface (optionally below a threshold size) may be filled in by interpolation from the surrounding surface.

Having generated an estimate of the 3D shape of the environment in the form of the voxel shell, a 3D model can be generated for printing.

Determining and Improving Model Integrity

Referring now to FIG. 5, in an embodiment of the present invention a target object (such as the illustrated character 520) is rendered from a plurality of viewpoints. Whilst previously it was suggested that at a minimum two images may be used, or only a few, in practice considerably more may be used in order to provide good coverage of the target object(s). Hence in FIG. 5, as a non-limiting example eighty renders are generated for each of three circular orbits of the character by a virtual camera, each orbit being equidistant about a circle orthogonal to the orbits themselves. It will be appreciated that the number of orbits and the number of renders per orbit are purely exemplary and any suitable combination of renders and orbits (or partial orbits, e.g. semicircular above a base height of the target object) may be considered, or distributions other than orbits (such as a distribution of camera positions over the effective surface of a sphere, either uniform or non-uniform, for example with additional camera positions near the position of the in-game camera when the original indication to capture the object was made). At the same time, for each render optionally depth (distance) data for each rendered pixel from the virtual camera position is also recorded, so that the position of each rendered pixel in the rendering space can be determined from the render, the depth information, and the camera position.

It will be appreciated that any scheme that results in sufficient viewpoints being provided may be appropriate; hence as an alternative to three orbiting virtual cameras, a constellation of (for example 80) stationary virtual cameras may be used. Similarly in either case the target object may be static or may itself be rotated in one or more axes, for example to provide each of a smaller constellation of cameras with several neighbouring views, effectively compensating for missing cameras at different viewpoints in a larger constellation.

The resulting N images (in this example 240) are provided as input to a known photogrammetry technique, for example as described previously.

Figure 6A:
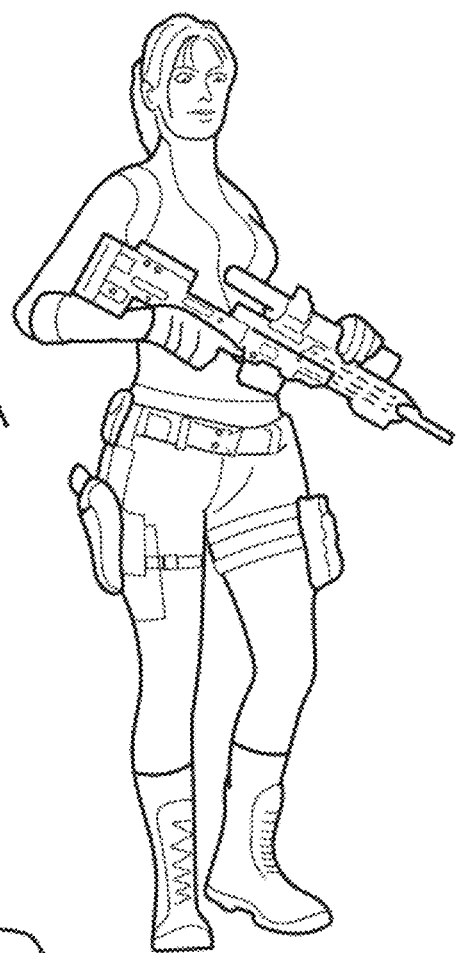
FIGS. 6A and 6B are illustrations of a 3D model generated by a virtual photogrammetry process based upon renders from the default virtual camera positions.
Figure 6B:

An example output of this technique is shown in FIGS. 6A and 6B. FIG. 6A shows a model of the character derived using virtual photogrammetry, and superficially it appears to be accurate. However, as can be seen from FIG. 6B, as highlighted by the oval ring, regions of the character's torso occluded primarily by the gun have not been modelled accurately, causing regions of the model to be fused or distorted.

Clearly a user having printed such a model would be disappointed with the quality of the result.

Figure 7:
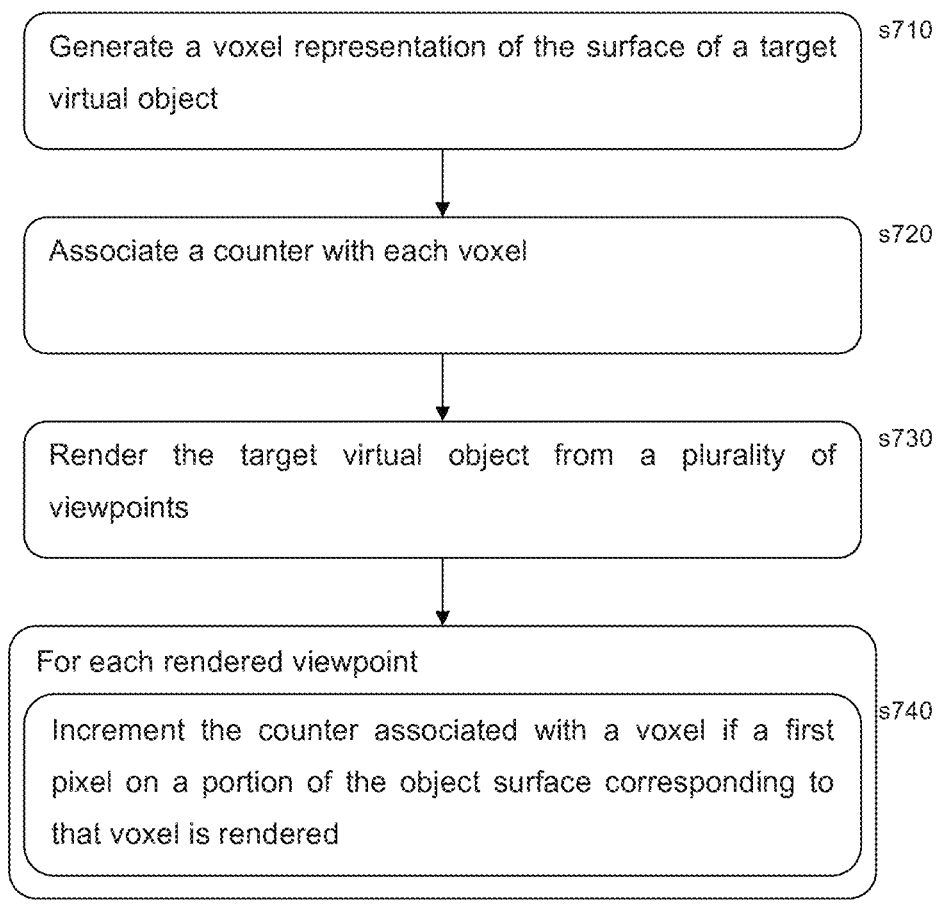
FIG. 7 is a flow diagram of a method of 3D print modelling in accordance with embodiments of the present invention.

Accordingly, and referring now also to FIG. 7, in an embodiment of the present invention a method of 3D print modelling comprises in a first step s710, generating a voxel representation of the surface of a target virtual object.

Figure 8A:
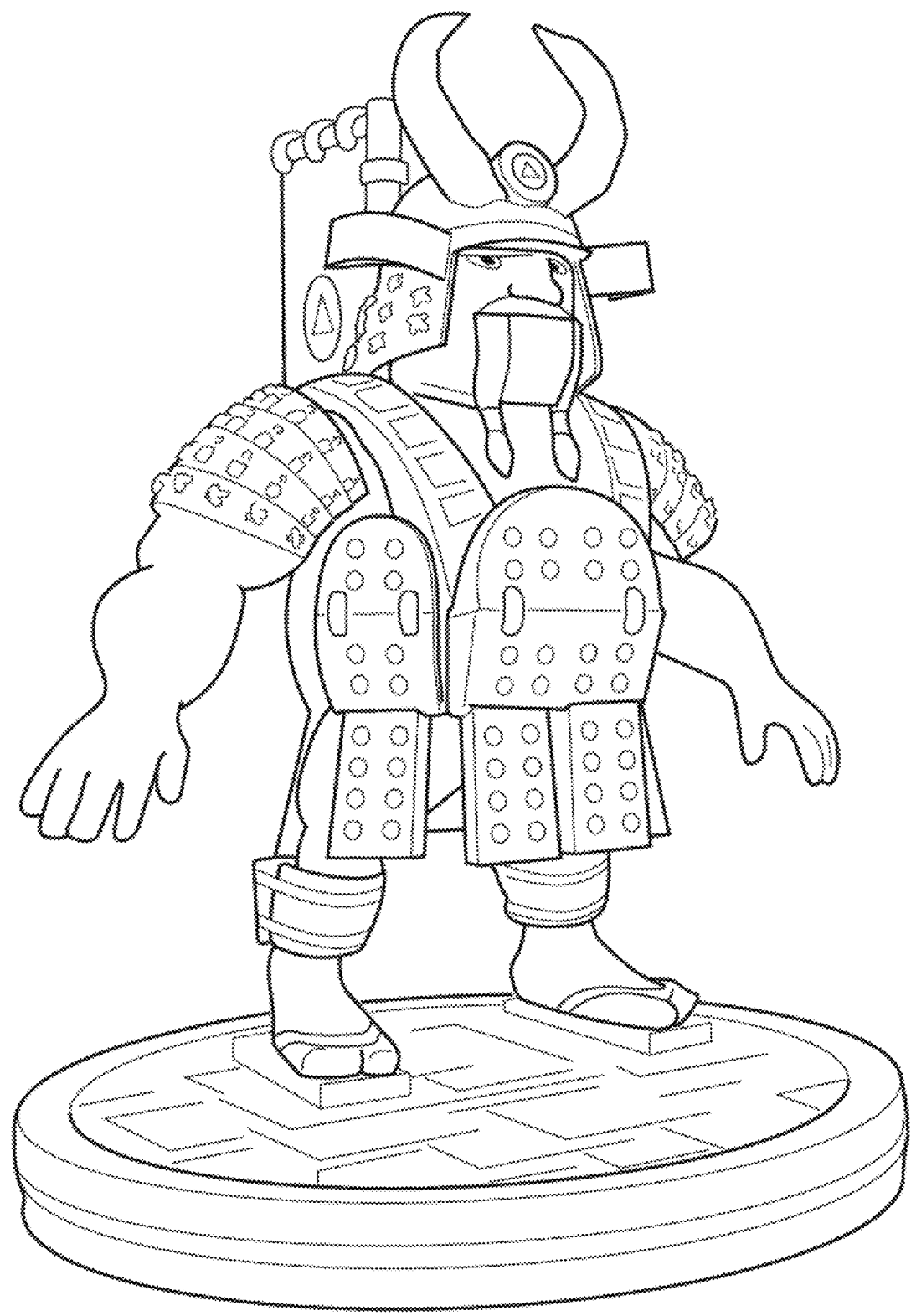
FIG. 8A is an image of a target object in accordance with embodiments of the present invention.
Figure 8B:
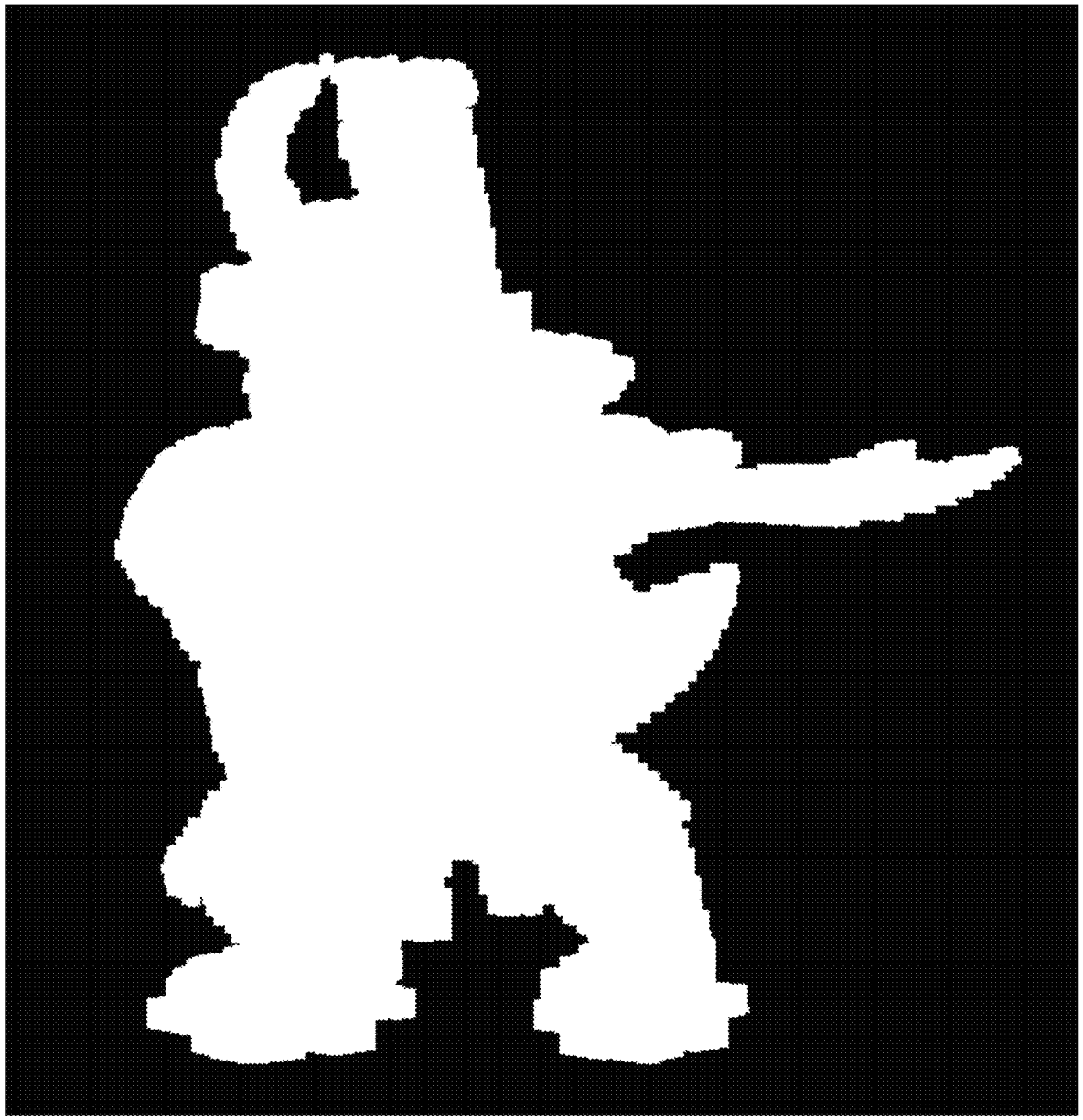
FIG. 8B is an image of a voxel model of the surface of the target object, in accordance with embodiments of the present invention.

It will be appreciated that having frozen the virtual environment/target object for the purpose of multiple renders, the actual object model remains static during the virtual photogrammetry process. Consequently it is possible to generate a separate and persistent representation of the model to track the progress of data gathering by each successive render. Referring now to FIGS. 8A and 8B, for the example case of a samurai character as rendered in FIG. 8A, a representation of that character can be generated as shown in FIG. 8B (in this case in a slightly different pose, about to swing an axe).

The separate and persistent representation is a voxel model of the surface of the target object(s) to be printed. As can be seen from a comparison of FIGS. 8A and 8B, typically the voxel resolution is lower than the render resolution, so that plural pixels in a rendered surface will map to a corresponding voxel in the voxel model.

The voxel resolution may optionally be selected to correspond to the voxel resolution of the 3D printer that is to be used. Hence for example if the 3D printer has a voxel resolution of 1 mm$^3$, and the printed model will be 10 cm high, then the voxel model will be 100 voxels high. It will be appreciated that whilst it is preferable to use a voxel resolution at least the same or higher than the 3D printer, this is not essential.

The voxel model can be generated using model data extracted during the rendering process, or can be rendered separately using the same target object model data.

In a second step s720, a counter is associated with each voxel. This counter is used to tally how many rendered images include a pixel from the portion of the target object(s) corresponding to that voxel, as will be explained later herein. Hence the voxels in conjunction with their counters form a voxel histogram of how many times each surface region corresponding to a voxel gets rendered during the photogrammetry process. This counter may thus be thought of as the main histogram counter for a voxel.

In a third step s730, the target virtual object(s) are rendered from a plurality of viewpoints as described previously, for example with reference to FIG. 5.

Then for each rendered viewpoint, in a fourth step s740, the main histogram counter associated with a voxel is incremented if a first pixel on a portion of the object surface corresponding to that voxel is rendered.

As was noted previously, typically the voxel resolution is lower than the rendered pixel resolution, meaning that potentially multiple (and variable) numbers of pixels may map to a corresponding voxel in any given render. Consequently the total number of pixels corresponding to a voxel in a render would be uninformative, and this would be compounded if the count accumulated over multiple renders.

Rather, it can be assumed that the first pixel in the render that maps back to a voxel can be taken as indicative that the region of the model corresponding to the voxel is appropriately visibly represented in that render.

A simple way to implement this check approach is to further associate a flag with each voxel, which is reset to a first state (e.g. to inactive, low, or 0, depending on convention) for each render. Subsequently, the counter of a voxel is only incremented if the previously described condition of rendering a pixel on a portion of the object surface corresponding to that voxel is met, together with the condition that its associated flag is in the first state. Then, if the main histogram counter is incremented, the flag is also switched to a second state (e.g. active, high, or 1, depending on convention).

By flipping the flag to a different state if the main histogram counter is incremented, and only incrementing that counter if the flag is in the default initial state, then the main histogram counter can only be incremented once per render, i.e. in response the first rendered pixel detected to be in the region of the target object(s)' surface corresponding to that voxel.

It will be appreciated that in principle different counting strategies could be used in addition to or instead of a flag scheme. For example optionally a parallel counter could be provided for each voxel that counts up to M (where for example, M is a number corresponding to a fraction of the pixels that in principle map to a voxel) when a pixel corresponding to that voxel appears in a render.

Hence for example in the previous case of 1 mm³ voxels for a 10 cm model, resulting in a voxel representation 100 voxels high, then if the rendered object is 1000 pixels high one can infer that potentially 100 pixels (10×10 pixels) could map onto a voxel, for example if viewed face on and without occlusion.

Hence for ½ of the pixels, the parallel counter would count to M=50. Meanwhile for ¹⁄₂₅ of the pixels, the parallel counter would count to M=4. In this case, the main histogram counter may only increment if the parallel counter reached the selected M threshold value. This would indicate that a non-trivial proportion of the pixels corresponding to that voxel had been rendered in a given view. The proportion may for example by anywhere in the range 100% to 1%, but more typically would be in the range 50%-1%, more typically still in the range 25%-2%, more typically still in the range 15%-3%, and more typically still in the range 10%-4%.

Similarly optionally, a parallel counter may be provided that counts up to P, where P is again a proportion of the possible pixels that may be rendered. At the end of the analysis of a given render, the final value in the parallel counter is added to the main histogram counter. This would enable a reflection of the different amounts of pixels being rendered for each voxel in a view, whilst limiting the degree of disparity between histogram values (continuing with the above example, if the fraction was ¹⁄₁₀, so that P=10, then a voxel that had 100 corresponding pixels rendered would only add 10 to its histogram, whilst a voxel that had 5 corresponding pixels rendered would add all 5 to its histogram. Over time it would still be clear what areas of the model were better represented than others, but without value disparities potentially amounting to plural orders of magnitude, which could make subsequent processing difficult.

Hence in this case, the method would comprise associating each voxel with a second counter that is limited to a predetermined maximum count value, and the step of incrementing the main histogram counter would comprise incrementing the second counter associated with a voxel, subject to the predetermined maximum count value, if a pixel on a portion of the object surface corresponding to that voxel is rendered, and then subsequently incrementing the main histogram counter by the final value of the second counter.

Referring again to FIGS. 5 and 8B, once all the renders at the predetermined camera positions have been completed and the relevant data for photogrammetry has been accumulated, the main histogram counters of the separate voxel model will have values indicative of how often (or optionally, indicative of how completely) the corresponding regions of the target object were rendered over all the different camera positions.

Figure 9:
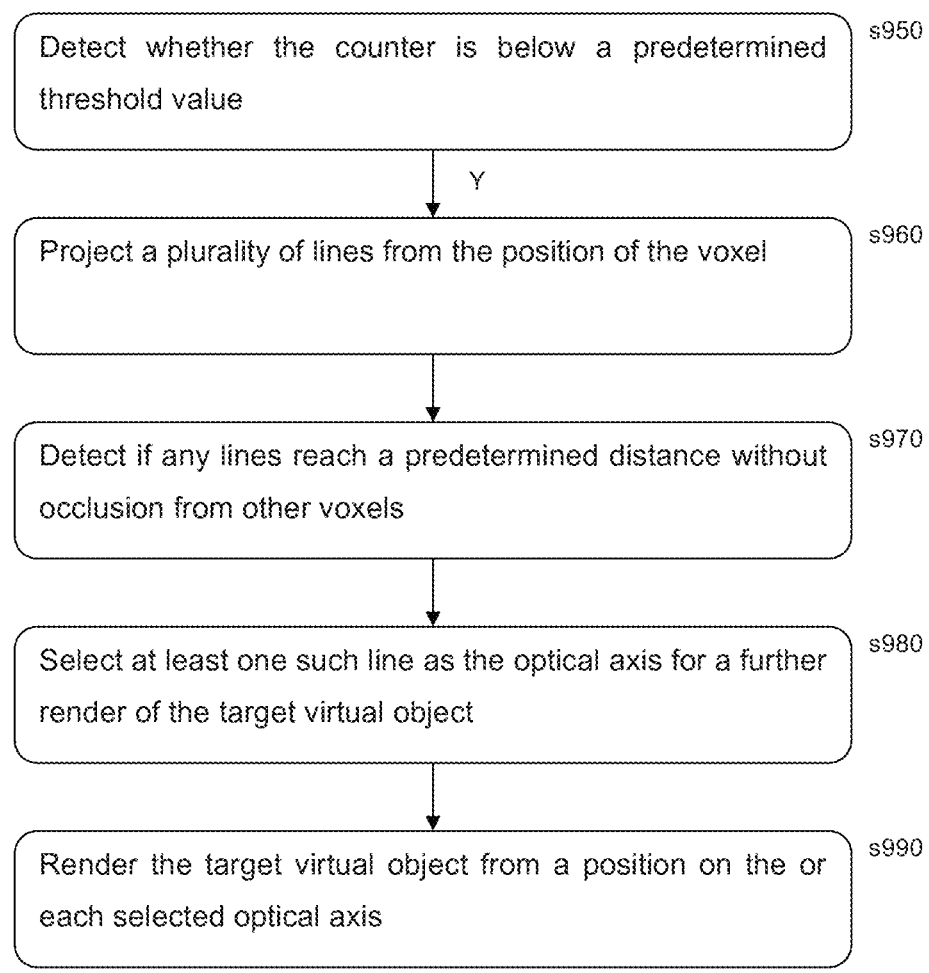
FIG. 9 is a flow diagram of the method of 3D print modelling in accordance with embodiments of the present invention.

Then, referring now to FIG. 9, in an embodiment of the present invention, the method of 3D print modelling proceeds as follows for each voxel:

In a fifth step s950, the counter is compared with a predetermined threshold value to detect whether it is below that value. If it is above the threshold value, then it is assumed that the region of the target object(s) corresponding to that voxel has been imaged sufficiently often to provide a good input to the photogrammetry process, which can proceed as described previously in order to generate a 3D surface geometry (and optionally but preferably also associated textures). The generated 3D surface geometry may be in the form of polygons, a point cloud, a high resolution voxel shell or any suitable representation for subsequent processing as describer later herein.

However, if the counter is below the threshold value, then it is assumed that the region of the target object(s) corresponding to that voxel has not been imaged sufficiently often to provide a good input to the photogrammetry process, and therefore at least one additional render is needed. For example Q-R renders may be sought, where Q is the predetermined threshold value and R is the actual value of the main histogram counter for that voxel. Alternatively, only one additional render may be sought.

To obtain this render, in a sixth step s960 a plurality of lines is projected from the position of the voxel (for example 16, 32, 64, 128, 256 lines equidistantly radiating from the centre or surface of the voxel). These lines can be thought of as candidate directions of view for a virtual camera that are guaranteed to intersect with the region of the target object(s) corresponding to the voxel (when looking back down the lines toward the voxel position).

Then, a seventh step s970 comprises detecting if any lines reach a predetermined distance without occlusion from other voxels. For example with reference to FIG. 5, it can be detected whether any lines reach the surface of the sphere upon which the virtual camera is positioned without interruption/occlusion by other voxels.

It will be appreciated that the point of intersection of any line with that sphere represents a position at with the virtual camera may be placed in order to obtain a render that includes at least some of the region of the target object(s) corresponding to the voxel, if the camera looks along an equivalent line.

Hence in an eighth step s980, at least one such line (as transposed to the render space, if the render space uses different co-ordinates) is selected as the optical axis for a further render of the target virtual object(s), and in step s990 a render of the target object(s) along the or each selected optical axis is then generated.

Where a plurality of lines reach the predetermined distance without interruption, then optionally all of them may be used in this manner, or a predetermined number of them, or Q-R of them, or just one. Where a subset of available lines are used, optionally the lines are chosen to maximise the distance between the selected lines on the camera sphere, so as to obtain diverse viewpoints of the relevant region of the target model(s).

In this way, additional renders for capturing views of under-represented regions of the target model can be identified and obtained to improve the required coverage of the model for the purposes of photogrammetry.

Hence after his process has been completed for any voxels whose count is below the predetermined threshold, again the renders can provide a good input to the photogrammetry process, which can proceed as described previously in order to generate a 3D surface geometry (and optionally but preferably also associated textures). Again, the generated 3D surface geometry may be in the form of polygons, a point cloud, a high resolution voxel shell or any suitable representation for subsequent processing as describer later herein.

Hence whether additional renders are required or not, the direct product of the photogrammetry process is the 3D surface geometry of the target object (and optionally any associated textures. This 3D surface geometry (and optional textures) may be exported to a separate device for modification as described later herein, or saved, shared to a local or remote, private or public repository.

Meanwhile, if for a given voxel no lines reach the predetermined distance without occlusion from other voxels, then optionally the number of lines may be increased (for example from 128 to 256 lines), thus increasing the line density and the opportunity for a line to have an uninterrupted route. Such a process may continue until a maximum number of lines is reached (e.g. 512).

If no lines reach the predetermined distance without occlusion (optionally after increasing the number of lines) then the method may comprise a step of issuing a warning to a user that the resulting photogrammetry will be based on an incomplete view of the target object(s), and hence that a 3D printed model based on virtual photogrammetry of the rendered object may contain errors. The method may then terminate, offer the user the option of terminating, offer the user the option of proceeding, or proceed.

In particular, where the number of lines reached a maximum number without any line reaching the predetermined distance, this implies that the view of the model region corresponding to the voxel is very limited, and so any resulting distortion or error in the model in that region may have a minimal aesthetic impact.

Optionally, the user may be provided with one or more renders of the model overlaid with a so-called 'heat-map', which colour codes regions of the model based upon the histogram counter values of the corresponding voxel. This provides the user with a simple indication of the quality of the source data (e.g. the number of renders) for any given region of the render.

Similarly, after photogrammetry is complete, the resulting model may be rendered for the user, such that for example the user can control the viewpoint and inspect the model. Again optionally the resulting model may have a colour heat-map overlay provided that indicate to the user the quality of the source data (e.g. the number of renders) for any given region of the resulting model. This may assist the user in more closely inspecting regions of the model that may comprises errors, before committing to 3D printing the model.

Modifying the Model

It will be appreciated that the 3D surface geometry generated by the photogrammetry process, whether expressed in polygons, or as a point cloud or as a high resolution voxel shell, will have a negligible thickness corresponding either to a notional zero thickness, or a one pixel thickness or a one (high resolution) voxel thickness. In any event, when translated to a 3D printer, this is likely to be interpreted as one print voxel thick (e.g. using the above example, 1 mm thick). This is unlikely to be adequate in practice for any given model.

Accordingly, and treating the 3D surface geometry now as a shell of voxels to be printed, the shell can be extruded to a predetermined thickness. The extrusion may be performed by adding adjacent voxels to each surface voxel on the side opposite to the side(s) from which they were projected into the shared virtual modelling space (i.e. on the inside or underside of the shell). The number of voxels added may be the lesser of Y voxels or the number needed to reach an opposite existing surface of an object. Y may be chosen to result in a thickness responsive to the weight and strength of the material being used to print the model.

Similarly, the lowest point within the (now extruded) model can be determined. At least two additional points, typically on the underside of the shell, can be extruded further to match the lowest point, thus providing at least three points of support for the physical model. Preferably, these points of support are distributed around a calculated centre of mass of the model.

In this way, a 3D model of the virtual environment can be constructed from plural in-game images that will stay up when physically printed and is viewable from a plurality of angles.

The model is then sent to a 3D printer driver, which slices the model into layers from the bottom up. These layers are then successively printed by the 3D printer as described previously.

As described above, photogrammetry of at least part of the virtual environment can be used to generate a voxel shell that can be used as the basis for 3D printed model. Some environments are more suited to this 3D printing process than others. For example, the simple block-based environment within Minecraft® will lend itself very well to being rendered by a 3D printer.

However, this is the exception rather than the rule. A particular appeal of video games is their ability to present environments and characters that are not bound by the normal rules of physics. In particular, objects may exist in a predetermined relationship to each other without having physical connections (as exemplified by the character 'Blobman' in FIG. 3, whose hands and feet are not physically attached to his torso in this figure), whilst other objects may be defined only in two dimensions within the three-dimensional environment, such as curtains, capes and in many cases environmental components such as walls. This is because physical strength is not a requirement of the virtual environment, where program rules prevent movement beyond certain boundaries, and the walls are simply decorative surfaces for textures demarcating those boundaries.

Hence a virtual environment may comprise several bounding surfaces that have zero thickness, upon which are placed physical objects, some of which may additionally be unstable or unsupported if physically printed. An example of such bounding surfaces may be the walls of the room 210 in the virtual environment 200 of FIG. 3.

It may not be feasible to faithfully print such a virtual environment using a 3D printer.

Accordingly, in an embodiment of the present invention, the voxel shell described previously is modified to take account of physical requirements of the 3D printed model.

As noted previously, the shell of voxels can be extruded to be M voxels thick, to provide some physical strength. This also addresses the problem of 2D objects within the environment, as the shell of voxels corresponding to these objects are extruded in the same as any other element of the shell of voxels.

However for some elements of the environment, this may not provide sufficient physical support, or in the case of aerial objects in the environment, support may be missing entirely.

Procedural Supplementary Geometry

Accordingly, procedurally defined modifications to the voxel shell may be provided for the purposes of 3D printing. These procedural modifications provide structural strength and/or physical support for some elements of the virtual environment that it would not otherwise be feasible to replicate in a 3D printed model.

Hereinafter references to 'printer geometry' refers the voxels created to define the 3D model for printing.

Procedurally generated or modified printer geometry may be generated by the entertainment device once the initial voxel shell has been generated.

The voxel shell is analysed to detect whether additional geometry is required, according to several basic rules.

One analysis step is to detect whether there are unsupported objects within the environment.

If so, then these may be made subject to a de minimis size threshold so that objects below the threshold, such as for example snowflakes, bullets etc., are ignored and subsequently not retained within the 3D model. The associated voxels in the voxel shell may be deleted. Optionally this step may be implemented in a modified rendering process so that these items are never rendered in the first place when collecting images for the model, making the analysis of the images simpler.

Meanwhile for objects that meet the threshold, printer geometry for a support structure such as connecting rod may be procedurally generated between the object and a nearby anchor point, the anchor point being a part of the environment ultimately connected to the ground. The ground itself can be assumed to be connected to the lowest point of the voxel shell. Optionally the analysis can proceed from the lowest part of the voxel shell upwards so that unsupported objects can be sequentially supported, enabling them to support subsequent objects in turn.

Consequently where a video game character is leaping into the air for example, a supporting rod will be formed between the base of their foot and the ground by creating a cylinder of voxels, for example M voxels thick by default.

However, the thickness of the rod may also be procedurally determined according to basic rules. For a given type of printer, the weight by volume of common 3D printer materials and their compression and bending strengths will be known. In addition, the expected size of the printed model will be known. Accordingly, the entertainment device can estimate the weight of unsupported objects, and calculate the thickness of supporting rod needed to adequately support the object within the model. In particular where a connecting rod is partly or wholly lateral and hence may bend, the moment of the unsupported object is a function of its weight multiplied by its distance from the current position along the rod. Furthermore when constructing a connecting rod for such an object, the weight of the connecting rod itself may be a significant proportion of the weight. Consequently the rod may be thicker closer to the anchor point and taper towards the unsupported object as respective parts of the rod support a greater weight at the anchor point than at the unsupported object.

In another analysis step, the above principle can be applied to other parts of the voxel shell; for example a virtual model desk within a game may have legs that are too thin to support the total mass of the desk surface and any objects on the desk. For example, if the desk has a character standing on it, but the desk legs are only a few voxels thick, they may not be strong enough to support the physical model. Accordingly features of the voxel shell can be evaluated to determine the total weight they will be supporting in the model, and where this exceeds a safe margin for the cross sectional area of the voxel shell supporting this weight, this may be thickened by scaling up its cross-section and filling it with voxels. The principle may also for example be applied to trees within the environment, where the cumulative weight of branches and the trunk are used to locally modify the geometry of the branches or trunk to make their cross-section larger to accommodate the weight, in those circumstances where the existing geometry is locally insufficient to accommodate the weight when rendered as a 3D model using the particular materials associated with the 3D printer.

Subsequently, the centre of gravity of the adjusted model may be calculated to detect if it would fall over. If so, then either a support may be moved to restore stability, or optionally the voxel shell may be thickened in one or more selected places to alter the centre of gravity back to a stable position.

As noted previously, two-dimensional components of the environment are extruded along with other parts of the initial voxel shell to create a three-dimensional object with at least a minimum thickness. However, this extrusion process can be further modified as described below.

Referring now to FIGS. 10A-E, it will be seen that FIG. 10A represents a two-dimensional wall from the environment 200, upon which a candle and candlestick are placed within the game. FIG. 10B then illustrates an extrusion process to extend the wall in a direction normal to the wall plane and opposite to the side from which the image was projected, to procedurally generate geometry describing a wall with a predetermined thickness, for example of Y voxels. However as can be seen in FIG. 10C, the cumulative weight of the physically printed wall will change according to the position on the wall, and also encounters a step change for parts of the wall additionally supporting the candle and candlestick. Accordingly, a wall of constant thickness may be unsuitable as the thickness of the wall near the base may be insufficient to adequately support the cumulative weight of the model.

Accordingly, with reference to FIGS. 10D-E, then starting with a minimum preferred thickness of extrusion at the top of the wall, the thickness of the extrusion increases as a function of cumulative weight, resulting in a step change in thickness at the point of attachment of the candlestick to the wall to provide additional support. It will be appreciated that procedural rules may thicken a region around such points of attachment, such that the wall is thickened slightly before the load of the candlestick is applied to the wall, as illustrated in FIGS. 10D-E. In addition, the procedural rules may accommodate the additional mass of the supportive thickening itself when extruding lower portions of the wall. Finally, the load imposed by the candlestick and the supporting region may be distributed laterally as well as vertically, so that the thickened supporting region splays sideways as it propagates down the wall, as shown in FIG. 10E.

The procedural rules may also interact with additional information provided by a game developer, to assist in generating desirable supplementary geometry automatically.

Figure 11:
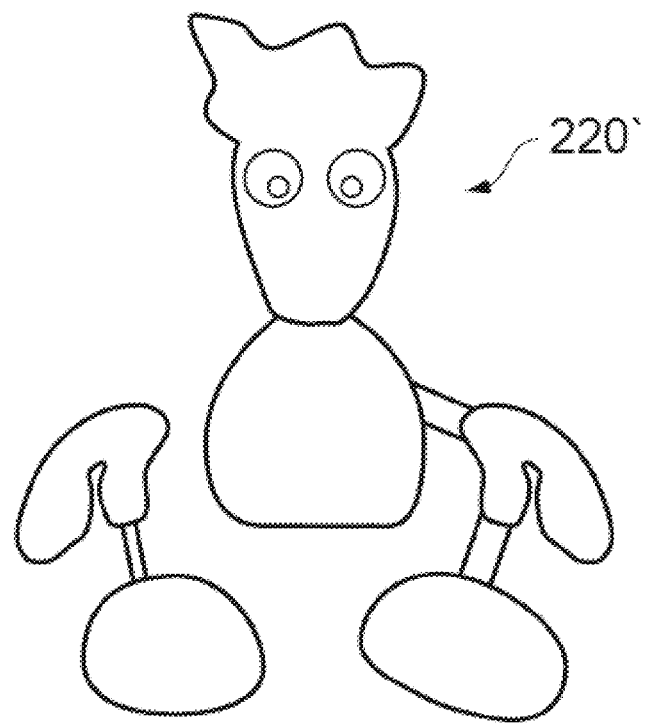
FIG. 11 is a schematic diagram of a 3D printable videogame character in accordance with embodiments of the present invention.

For example, the previously noted rule that a connecting rod is procedurally generated between an unsupported object and the nearest anchor point, where the anchor point is a part of the environment ultimately connected to the ground, may result in 3D model of Blobman 220' as illustrated in FIG. 11. It will be appreciated that when the character's hands are analysed, it is likely that they are closer to the character's feet than to the character's torso, and possibly also that the character's torso will not yet be connected to an anchor structure itself. Accordingly the procedural rules may attach the character's hand to the only grounded anchor points available, which are the feet; subsequently the torso may be anchored to the closest single anchor point, which is now one of the hands. The result is a structure that, whilst stable, does not conform anatomically to what the user might expect.

Figure 12:
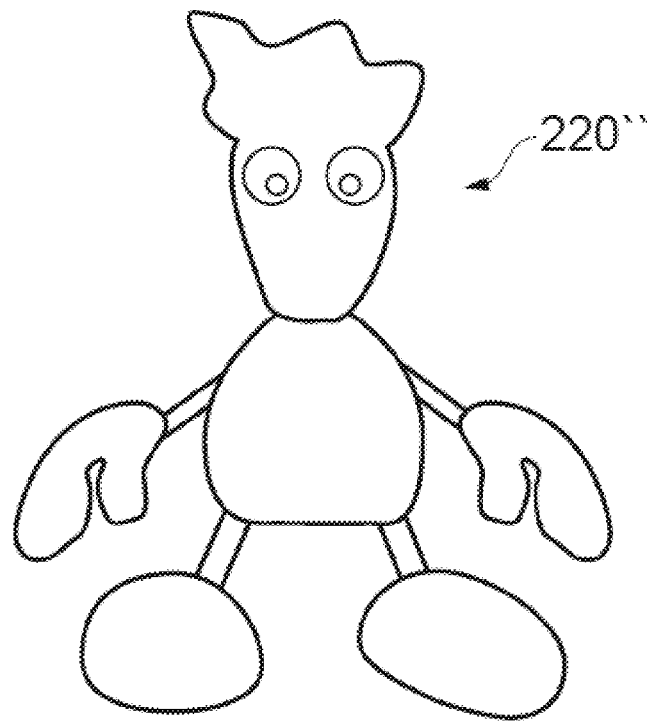
FIG. 12 is a schematic diagram of a 3D printable videogame character in accordance with embodiments of the present invention.

Accordingly, game developers (or users) may identify preferred points of connection between elements of the environment in order to guide the procedural generation of connecting rods or other connecting/support structures. These points of connection may be defined by use of a reserved value within one or more colour channels, enabling points of connection to be identified by use of a specifically coloured identifying pixel within an image; for example if the value 128 was reserved on the blue channel to denote a connecting point, then this can be used in the example of the Blobman character 220" of FIG. 12 to specify where preferred connecting points exist on the model. These reserved values are then used within the voxel shell, creating identifiable anchor points for use with the procedural rules. For example, matching values in the other two colour channels of the identifying pixel can be used to indicate paired connecting points, so that red and green values in the identifying pixel could be the same for the hand and the torso, causing these to be identified as sections to be connected together. In this way, artistic control of the placement of connecting structures can be maintained by the developers without the need for separate metadata. In the case of Blobman, this could be used to ensure an anatomically acceptable set of connecting rods, as can be seen in FIG. 7. Meanwhile, the rules for procedural generation of the connecting/support structure will still determine the required cross-section needed to adequately support the printed structure.

It will also be appreciated that for elements of the supplementary printer geometry not found in the rendered game (such as the connecting rods in the 'Blobman' example above), textures (colours) may be extrapolated from the existing voxel shell, or a no colour may be specified. In the case that colours are extrapolated, optionally the colours may be extrapolated from the portion of the structure supporting an element against gravity (e.g. the ground, or in the case of Blobman, from the feet to the torso, and from the torso to the hands and head, respectively), as this is likely to create the most unobtrusive supporting structure within the model. Alternatively in the case of using no texture, the bare plastic (or other 3D printer material) is left exposed, making it clear to the viewer that this is a functional support that is not part of the original image. Which approach is preferred may be an artistic decision for the user.

It will also be appreciated that the pixel resolution of the rendered images may be higher than the voxel resolution of the 3D printer at the scale chosen for printing. Consequently features of the rendered environment may sometimes have a high spatial frequency relative to the voxel resolution of the 3D printer. Accordingly the images may be filtered to a compatible resolution before projection into the shared virtual model space, to remove such high-frequency detail and thereby avoid aliasing effects in the resulting model. In this case, where reserved colour channel values are to be used by procedural rules, these are preserved or reinserted into the lower resolution image after filtration. The depth information may be similarly filtered.

Hence, using any or the above techniques, or any other suitable techniques, a property of the 3D surface geometry (such as its thickness or connective elements) may be modified to form 3D printable model data that may be output for 3D printing either immediately or prospectively in the future. Consequently, a direct product of modifying a property of the 3D surface geometry to form 3D printable model data that is then output, is 3D printable model data. This 3D printable model data may be output directly to a printer, or alternatively to a local or remote, private or public repository for review by the user or others, prior to any decision to print the model.

Flood Fill Algorithm

It will be appreciated that when models for 3D printing come from a computer-aided design package they are well structured and easily processed for 3D printing. However when videogame data is to be printed, the captured models can contain degenerate polygons and/or zero thickness features (such as for example those discussed in relation to FIG. 10 previously herein).

One approach to making these models printable is to initially identify solid (enclosed) areas in models and then perform operations to strengthen or thicken these areas as needed, for example in accordance with approaches such as those described elsewhere herein.

Figure 13A:
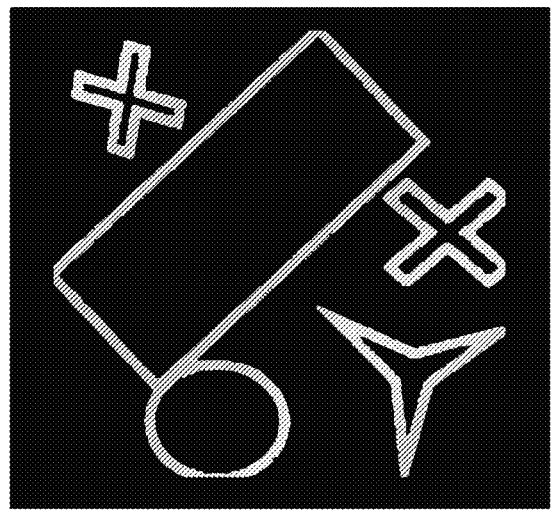
FIGS. 13A, B and C are illustrations of traditional flood-fill operation.
Figure 13B:
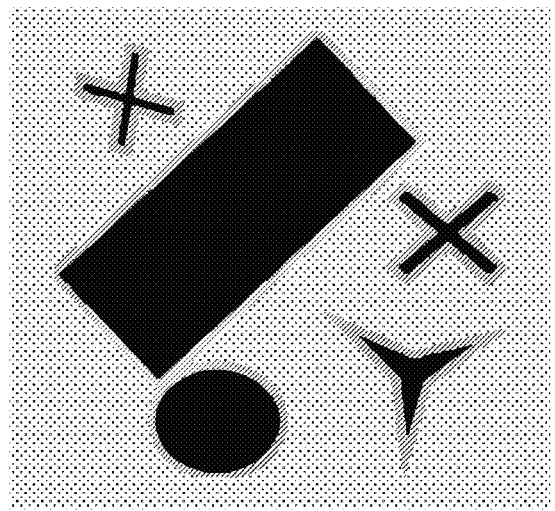
Figure 13C:
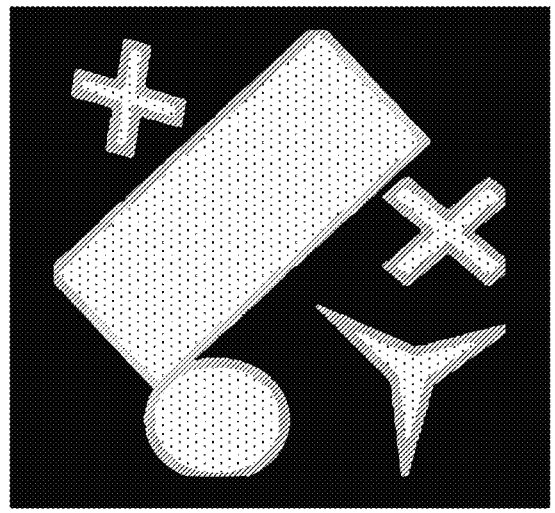

Referring now to FIGS. 13A-C, to identify solid or enclosed areas, for example within a slice of a 3D voxel model, a flood-fill technique can be employed to identify the solid regions in the slice.

FIG. 13A illustrates an example 2D slice, in this case comprising five enclosed areas. To identify these areas, then in FIG. 13B, a flood fill can be instigated from the outside edge of the slice, to occupy those portions of the slice not in the enclosed areas.

The resulting flood fill can be treated as a mask, and by inverting this mask as shown in FIG. 13C, the enclosed areas are identified.

Whilst in principle it would be possible to directly flood fill each of the individual enclosed areas, which may require less computational resources if the area of the slice that gets filled in is smaller, this requires foreknowledge of where the enclosed areas are. Such foreknowledge cannot be guaranteed. Therefore by using a flood fill from the outside of the slice, enclosed areas can be identified without any prior knowledge or assumptions about their presence or location.

However we appreciated that for a detailed 3-D model, the number of slices to process in this manner may be very large, and each slice may be of a high resolution. As a result, the computational load of the flood fill process may be very high. This issue may be exacerbated if the flood fill process is used frequently, for example to evaluate the integrity of the model after or during the creation of supplementary geometry or after user edits have been made.

Therefore it would be preferable to implement a computationally efficient flood fill algorithm.

The conventional flood fill algorithm is a popular method of filling a connected area of same colour pixels with an alternative colour. However, this algorithm is inherently sequential because the algorithm steps from pixel to pixel filling them as it goes.

Meanwhile, on entertainment device such as the Sony PlayStation 4®, the preferred processing platform for such a flood fill algorithm is the GPU. However GPUs have large numbers of execution threads that do not efficiently run sequential processes.

Hence in an embodiment of the present invention, in order to take advantage of GPU processing, a parallel flood fill algorithm is provided so that parts of the virtual process can be executed simultaneously.

In brief, the parallelised flood fill algorithm constructs a quad-tree for the image to fill. The quad-tree stores a multi-resolution representation of flood-fill source pixels along with some additional data (described later herein) to accelerate the fill operation.

The quad-tree traversal starts at either the root of the tree (for an outside-in fill), or a leaf node of the tree (for a pixel-seed fill). The traversal traverses at the lowest quad-tree level (largest area nodes) allowable by the local feature size in the image, to improve the fill speed across the image.

During traversal, the entry edges to each quad-tree cell that is processed are tracked to correctly traverse into child quad-tree nodes, and to direct the flood operation when stepping to adjacent cells.

The result of the algorithm is a flood mask, which indicates the pixels that have been filled. The mask is preferably stored in a Morton (z-order) curve so that all of the pixels relating to a quad-tree cell (at any quad-tree level) are contiguous for faster processing. The mask can later be used to generate an image form the source image with flooded pixels, or for other purposes, as described later herein.

Notably the algorithm can also be extended to 3 dimensions by using an octree, tracking all 8 entry planes per cell and a 3 component Morton curve for the fill result mask address, to implement a volumetric flood fill.

In more detail, the algorithm is described below, using the following terminology:

Flood fill source colour: This is the source colour in the image to be replaced by the target flood-fill colour. For example the flood fill source colour in Images 13A and 14 is black.

Flood fill target colour: This is the target colour to replace connected regions of flood-fill source colour. For example, the fill target colour may be white.

Figure 14:
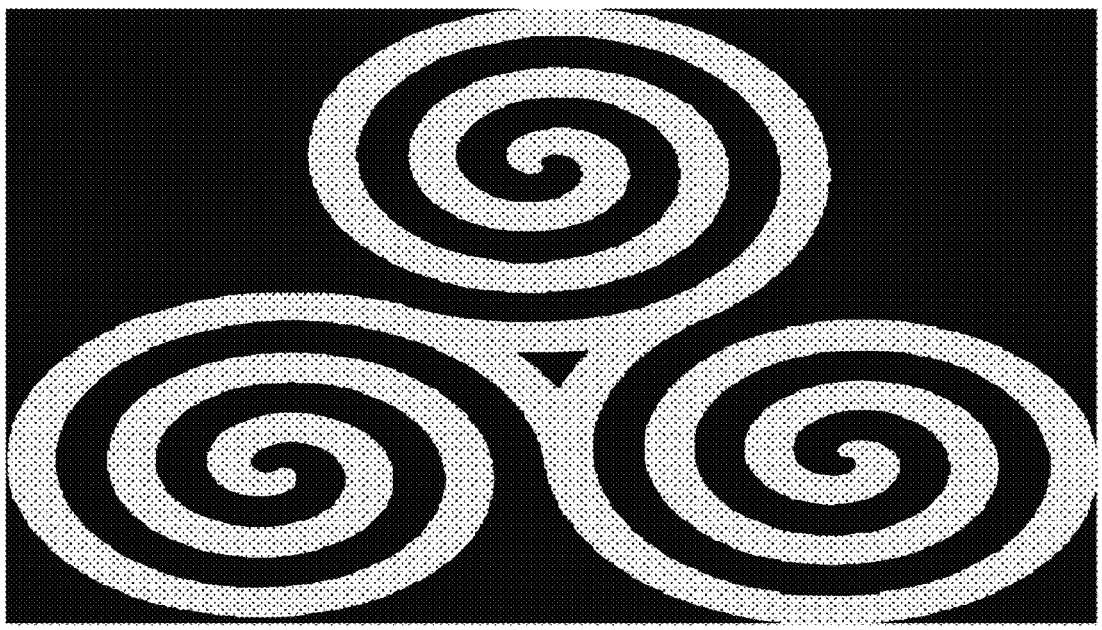
FIG. 14 is a schematic diagram a 2D image to be flood filled in accordance with embodiments of the present invention.

Border pixels: These are any pixels in the source image that are not of the flood fill source colour. In FIG. 14 the border pixels form three spirals and are primarily of a single colour, but the anti-aliased edges that blend this colour and the flood fill source colour are also border pixels. Hence typically all border pixels (optionally to within a predetermined tolerance of the flood fill source colour) are preserved during a flood fill.

Quad tree: The acceleration structure (spatial partition scheme) used to enable multi-threaded traversal across the image at varying resolution dependent on feature detail.

In an embodiment of the present invention, the quad tree used to process the flood fill contains 3 pieces of information:

1) A bit ('occupy_all') indicating that all pixels within a quad-tree cell are border (non-flood-fill source colour).
2) A bit ('occupy_some') indicating that at least one pixel within a quad-tree cell are border (non-flood-fill source colour).
3) For cells completely empty of border pixels an elevation depth is stored that indicates by how much the quad-tree can be climbed towards the root whilst still staying in a fully non-border cell.

Typically 6 bits are necessary for the quad-tree entries, for image sizes up to 65536×65536—The elevation depth has an upper limit of log 2(imageSize), and one bit is required for each of the other two fields.

Figure 15:
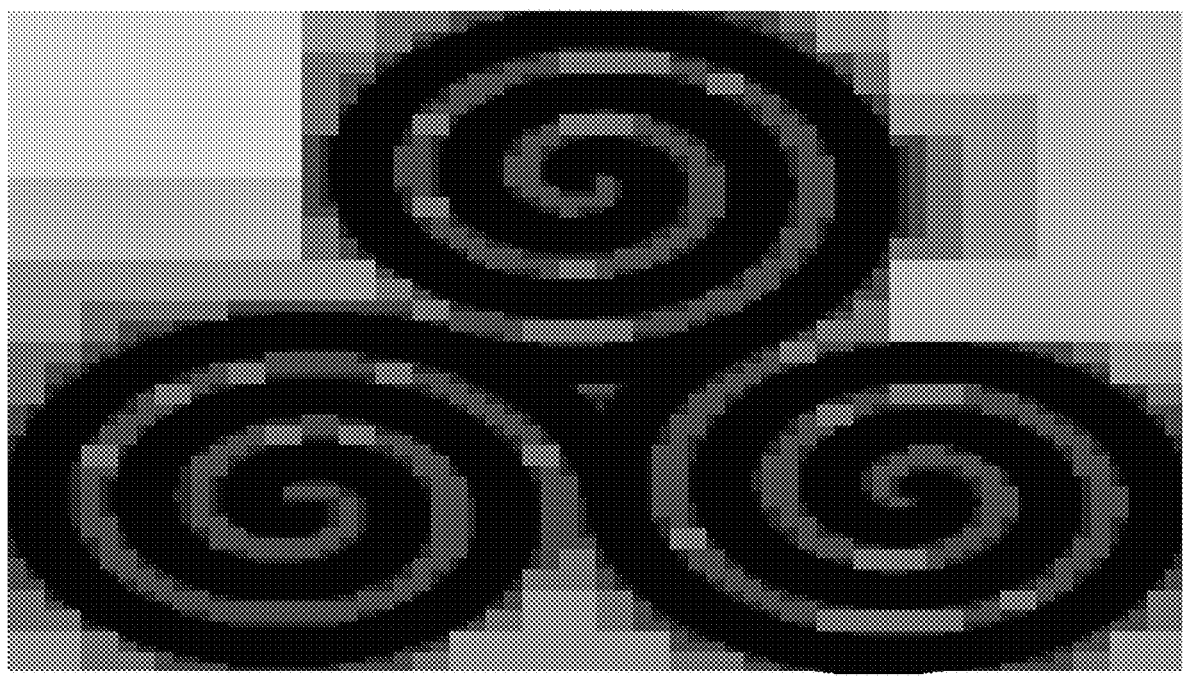
FIG. 15 is a representation of elevation depth values based upon image occupancy within cells of a hierarchical space-partitioning scheme, in accordance with embodiments of the present invention.

The elevation depth is a good indicator or proxy for the openness of the flood-fill source colour at any point in the image. FIG. 15 visualises the elevation depth for the image of FIG. 14, and shows the resulting quad-tree structure, with lighter shades of grey representing larger elevation depths, meaning that larger quad-tree cells are to be used to fill that area of the image.

The flood fill algorithm proceeds using the quad-tree level closest to the root of the quad-tree for the local feature size. Thus when the fill operation nears an edge it will move towards the leaves of the tree. If the algorithm squeezes through a gap in a filled region into an open area it will move back towards the quad-tree root for more efficient filling.

In a first step, a top level pixel occupancy is generated.

This identifies occupancy information for border pixels in the image by testing against the flood source colour. The result of this is a 2D array of quad-tree cells for the quad-tree leaves, where each cell relates to a pixel in the source image and contains the same value in the occupy_all and occupy_some bits (since each cell contains 1 pixel).

In a second step, a mipmap level pixel occupancy is generated.

For each group of 2×2 cells in an occupancy level, occupy_all and occupy_some information for a merged cell are generated by ANDing all child occupy_all and ORing all child occupy_some fields. This is repeated until the top level has only 1 cell with occupy_all and occupy_some for the entire image. After this stage the quad-tree structure is complete. The next stage generates some additional information for accelerating the traversal process during execution.

The cell elevation depths are also initialised to zero at any point before, during or after the first or second step above.

In a third step, the depth elevation values are generated.

Starting at the root of the quad and working toward the leaves, for all cells that are fully vacant of border pixels (occupy_some=0), the elevation depth for its 4 children is set to be 1 larger than the current cell. This is repeated all the way down to the leaf nodes of the quad-tree (that each represent 1 pixel in the image). The elevation depth will, for any cell allow the algorithm to step towards the root of the tree whilst staying within empty nodes, and allows the algorithm to process large contiguous areas of flood-fill source colour quickly.

Figure 16:
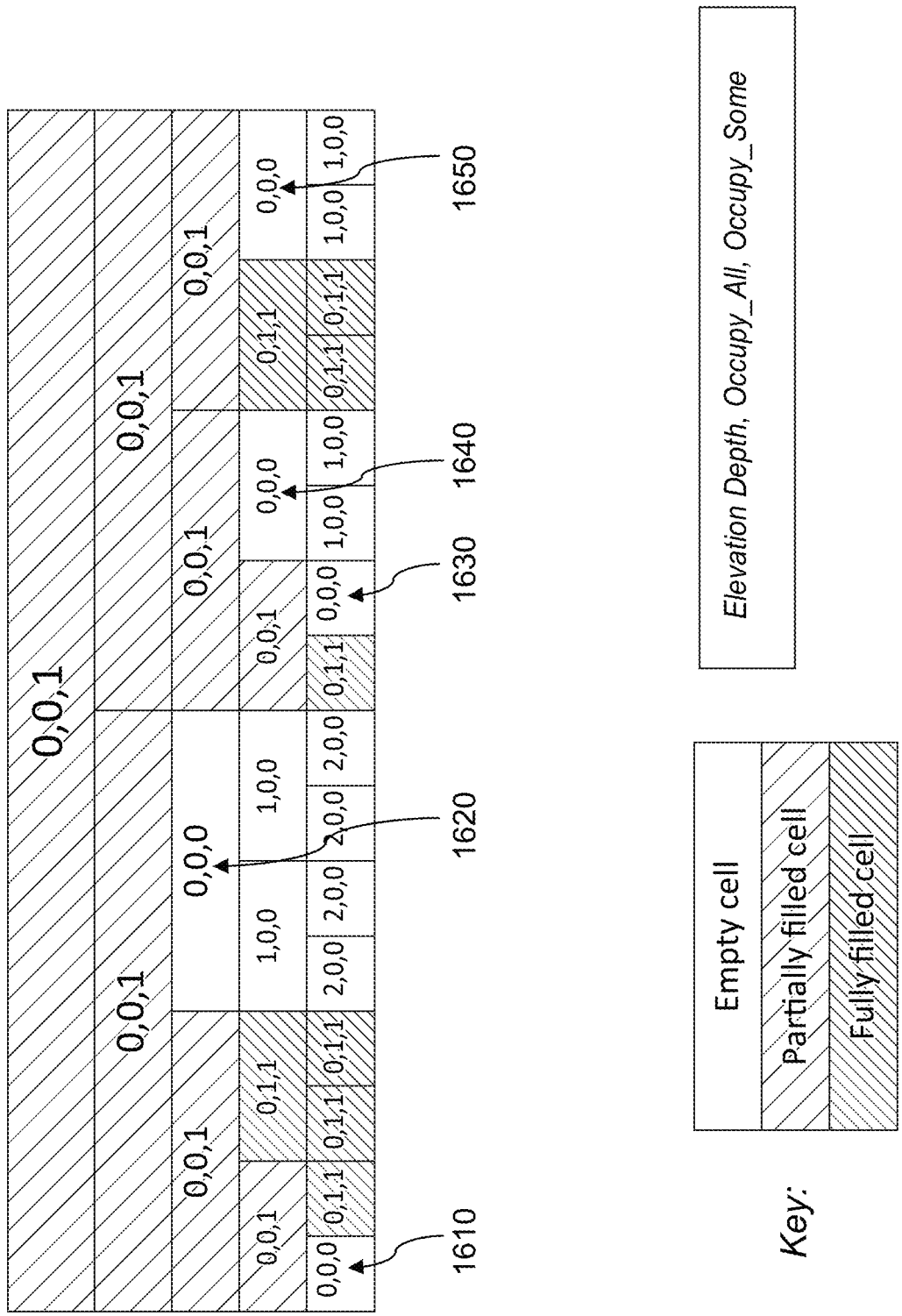
FIG. 16 is a schematic diagram of elevation depth values based upon image occupancy within cells of a hierarchical space-partitioning scheme, in accordance with embodiments of the present invention.

FIG. 16 illustrates a slice through a quad-tree (here expressed as a binary tree) which demonstrates the data that might be stored. The bottom row comprises the 16 pixels of an example source image, combined up to a single node at the root of the tree. In each cell the first number is the elevation depth, and describes how far up the tree it is possible to go whilst staying in a fully vacant cell. Hence in this case, 5 uppermost cells can be identified (1610-50).

In a fourth step, the flood fill is executed.

The flood fill can execute in two modes. Either outside-in, or from a seed pixel. The two methods differ only in the starting condition of the algorithm. Outside in starts from the outside of the image, from the root of the quad-tree (where the quad-tree cell represents the entire image). The pixel seed starts from a leaf node of the quad-tree (where the nodes represent a single pixel).

The algorithm works on a stack of work items that can be executed in parallel. The work list items identify a node within the quad-tree, along with a list of directions that the cell was entered from. The directions allow the algorithm to make corresponding decisions when traversing down the quad-tree to finer cells, or when skipping to adjacent cells. Work list items have the format:

| Quadtree level | List of edges this cell was entered through | Cell X | Cell Y |
| --- | --- | --- | --- |

It will be appreciated that the flood fill algorithm effectively has a flow as it progresses through the image/cells of the tree structure. The entry edges of cells track the direction of the flood fill as it flows through the image/cells.

A cell can be entered from zero or more edges (zero only occurs for an initial seed fill pixel, all 4 edges only occurs for the initial "entire image" cell of an outside-in fill). Typically a cell is entered through one entry edge (a side) or two entry edges (e.g. a corner) as the algorithm proceeds.

A cell has 4 edges with the top, bottom, left and right edges bounding the quad. The algorithm then tracks how a cell has been entered so that child cells can be selected in the correct order, as explained below in relation to child cell recursion. This occurs when a cell contains border pixels that could block the flood fill. Using the edges to select child cells ensures that the child cells are processed in the correct order and prevents the flood fill jumping over border features.

It will be appreciated that for an oct-tree, there are 6 edges (faces of a cube), but the principle is otherwise the same.

Work list items are pushed and popped to a stack from multiple threads in a GPU thread group.

The initial state of the work list contains a single work item, depending on the mode of the fill.

For outside in:

| Quadtree level | List of edges this cell was entered through | Cell X | Cell Y |
|---|---|---|---|
| Root level | Left, right, top, bottom | 0 | 0 |

For pixel seed:

| Quadtree level | List of edges this cell was entered through | Cell X | Cell Y |
|---|---|---|---|
| Leaf level | None | PixelX | PixelY |

As noted above, many work items may be popped from the stack and processed in parallel by many GPU threads, as the algorithm proceeds as follows: a work item is taken from the stack, which specifies the following information:
Quadtree level.
Entry edges for the cell.
Cell XY coordinates.

The occupancy of the work item cell is read, with the occupancy specifying the following information:
The elevation depth.
The occupy_all bit indicating that all pixels in the cell are border.
The occupy_some bit indicating that some pixels in the cell are border.

The cell is then elevated using the elevation depth from the occupancy. This entails:
Adjusting the quad-tree level from the work item using the elevation depth from the occupancy.
Adjusting the cell coordinates using the elevation depth.

The work that needs to happen for the cell is then determined, based upon the occupy_all and occupy_some bits:

| Occupy_all | Occupy_some | Action |
|---|---|---|
| 1 | <Any> | Discard cell, no further action required. |
| 0 | 1 | Recurse to child cells based on entry edges. |
| 0 | 0 | Fill cell and traverse to neighbours based on entry edges. |

The process then repeats from the beginning, until there are no work items left to process.

The three actions (cell processing cases) above are as follows:

'Discard cell, no further action required': In this case the cell is completely full of border colour, there is no further processing to be done with this cell and it can be discarded. No further work is generated for the work item stack.

Figure 17A:
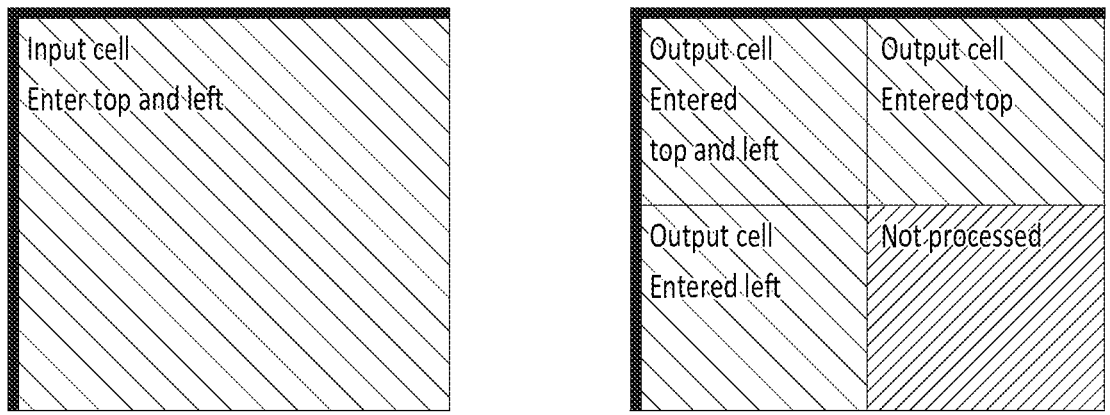
FIG. 17A illustrates recursion to child cells within the hierarchical space-partitioning scheme, in accordance with embodiments of the present invention.

'Recurse to child cells based on entry edges': referring to FIG. 17A, the cell is partially filled and potentially contains some space to fill. Work items are generated for the child cells, selected by the entry edges. For example entering the parent cell from the top and left would result in three child cells being processed, with various combinations or entry flags as described in FIG. 17A (entry edges denoted by bold edges). New work items are pushed to the stack for all relevant child cells, with the correct edge entry flags.

Figure 17B:
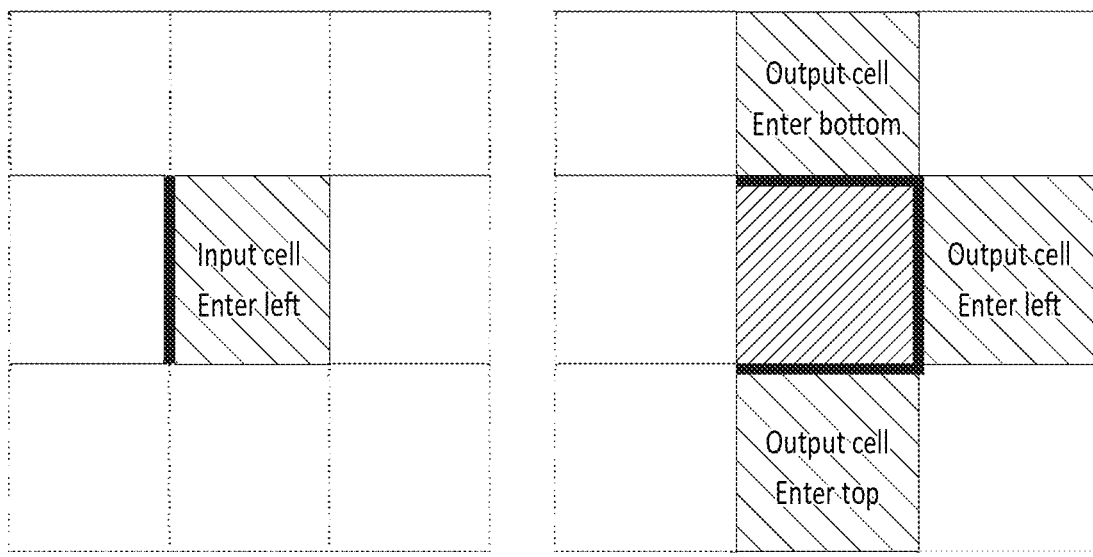
FIG. 17B illustrates traversal to neighbouring cells within the hierarchical space-partitioning scheme, in accordance with embodiments of the present invention.

'Fill cell and traverse to neighbours based on entry edges': referring to FIG. 17B, in this case the cell is completely empty of border pixels and needs filling. However, since there are multiple routes to a cell, this cell may already have been filled by another thread/work item. If the cell has not already been filled (determined by testing the fill mask result), the fill should then traverse to neighbours, avoiding the neighbour from which this cell has been entered from. New work items are pushed to the stack for all relevant neighbour cells, with the correct edge entry flags. It will be appreciated that entry edges are the edges a flood fill enters a cell from (as shown in the left hand image for FIG. 17B), and when traversing to neighbours the output cells are all of the neighbouring cells except the entry edge cell, as shown in the right hand image of FIG. 17B, as it can be assumed that the cell in the direction from when the current cell was entered has already been processed.

Using this approach, the flood fill algorithm can populate the fill mask, and the quad-tree elevation mechanism ensures that the cells that are filled are the largest possible based on the local feature size. If the fill mask is stored in Morton order, then all of the pixels for a quad-tree cell are contiguous in the fill mask and processing is faster.

The above quad tree approach provides for a computationally efficient implementation of flood filling when using a GPU or similarly parallel processor having a large number of execution threads that do not efficiently run sequential processes. It enables analysis of a large number of slices of a model that is prospectively being 3D printed to be analysed for fully enclosed regions and the like.

Figure 18A:
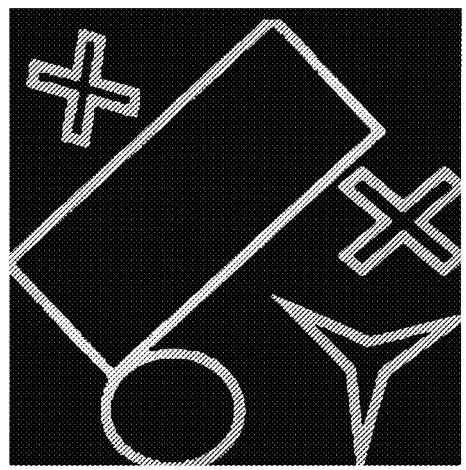
FIGS. 18A, B and C are illustrations of an improper flood-fill operation.

Furthermore, the algorithm performs better than a traditional flood fill algorithm in certain cases; referring to FIG. 18A, this replicates the example slice of FIG. 13A, but now objects within the slice extend to the border of the image (or put another way, the image has been cropped to the minimum size encompassing the objects therein, which of course reduces the overall image size and hence computational complexity).

Figure 18B:
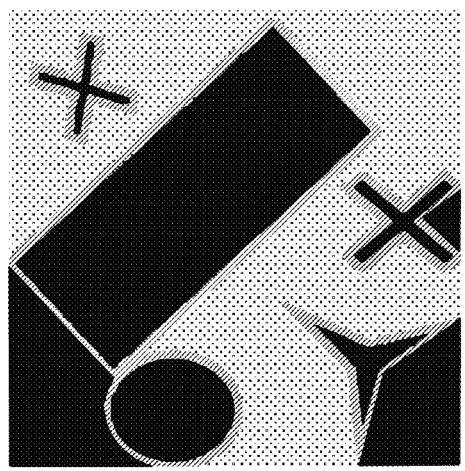
Figure 18C:
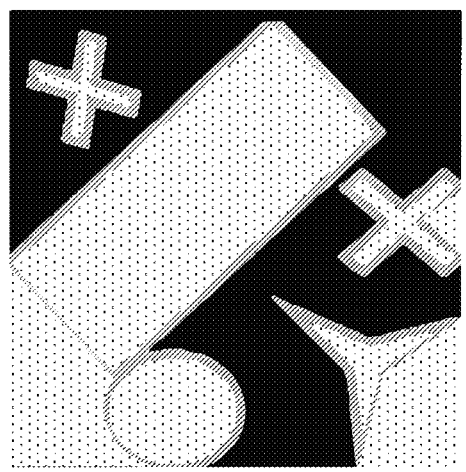

However, referring now to FIGS. 18B and 18C, a traditional flood fill starting from an initial point (for example the top left corner of the image) cannot progress into the bottom left and right corners of the image as seen in FIG. 18B, as these are effectively blocked off by objects in the image. As a result, the enclosed regions are mischaracterised in FIG. 18C.

By contrast, the present invention can fill in based on the edges of a slice/image instead of from a single seed point (although it can do this too, as described previously); as a result it would still correctly identify the regions in the bottom left and right corners of the image.

It will be appreciated that this is also illustrated by FIGS. 14 and 15; because of the extent of the spiral pattern, it actually divides the background into four separate segments; however the system identifies each of them (as can be inferred from the elevation map in FIG. 15).

Figure 19A:
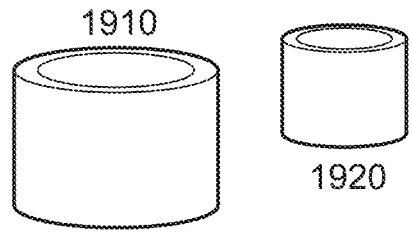
FIG. 19A is an illustration of objects to be assembled for 3D printing.
Figure 19B:
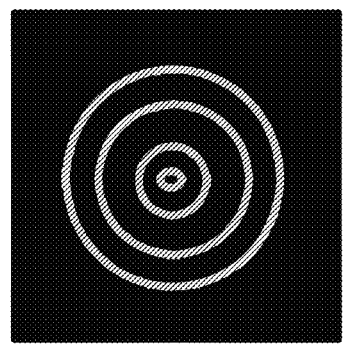
FIGS. 19B, C and D are illustrations of an improper flood-fill operation.

However, even the quad tree algorithm can encounter difficulties, and hence there is still scope for further refinement:

Referring to FIG. 19A, in an example scenario a pair of cylinders (1910, 1920) is arranged concentrically within an object of the game environment to be 3D-printed. In FIG. 19B, a resulting slice through the object shows concentric walls defining alternate gaps and enclosed regions within the slice.

Figure 19C:
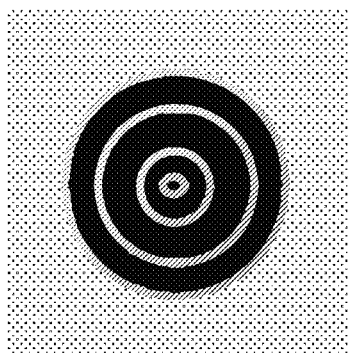

Referring to FIG. 19C, even when filling from the edges of the slice image, a flood fill algorithm cannot (and should not) pass the outer wall of the outer cylinder. As a result, the intermediate void between the outer and inner cylinder, and the central void of the inner cylinder are not identified.

Figure 19D:
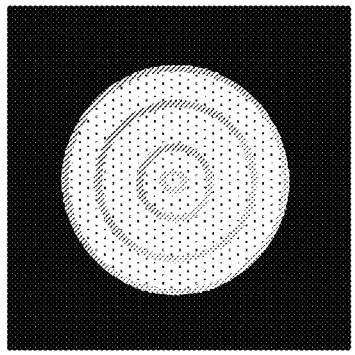

As a result, in FIG. 19D the internal structure of the cylinders is lost and it is represented as a solid object. Clearly this is undesirable both in terms of loss of fidelity of the model, and a waste of 3D printing materials.

Accordingly, in an embodiment of the present invention the use of a quad-tree to navigate a 2D image slice is replaced by an oct-tree to navigate a 3D (volumetric) image.

In other words, instead of performing a flood fill of a sequence of 2-D slices of a model using a quad tree, the algorithm performs a flood fill on a single volumetric image of the model using an oct-tree. As will be appreciated, where each level in a quad tree divides a rectangle into four child rectangles, each level in an oct-tree divides a cuboid into eight child cuboids. The remainder of the algorithm, relating to creating work items elevation depths, occupancy data and the like is then essentially the same (with six possible entry planes for a volumetric cell fulfilling the same function as four possible entry edges for a 2D cell).

Figure 20:
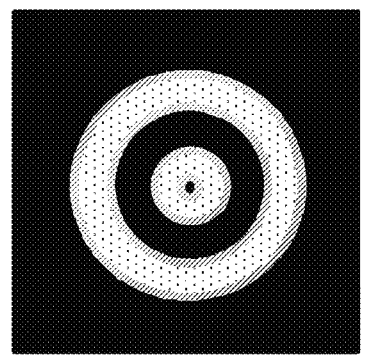
FIG. 20 is an illustration of a correct flood-fill operation in accordance with embodiments of the present invention.

Returning to the example of FIG. 19A, it will be appreciated that when represented as a single volumetric image and subjected to a volumetric flood fill using an oct-tree version of the previously described algorithm, the problem of the concentric cylinders is resolved, because the algorithm will identify the gaps at the top and bottom of the cylinders and so will fill the intermediate and central voids, as illustrated (for a 2D slice of the result for the purposes of illustration) in FIG. 20.

Hence more generally it will be appreciated that the flood-fill algorithm described herein employs a hierarchical space-partitioning data structure to break the flood-fill problem into work units that can be processed in parallel (for example by a GPU), the structure typically being either a quad-tree for 2D images or an oct-tree for volumetric images, with the generation of the elevation depth data in response to the occupancy of features in the image at different levels of the data structure enabling efficient navigation of it and efficient identification of empty image regions.

Further variants can be considered regarding when and how to use the algorithm for the purposes of 3D printing.

By way of example, referring to the Samurai illustrated in FIGS. 8A and 8B, in the voxel capture of the Samurai the character's axe may be a separate object that, in practice, is slightly spaced apart from the character within the videogame environment (for example either because the character is modelled to hold many different items and not all of them can perfectly match, or because of the particular position of the character/axe at the captured moment for printing, or because the character was just starting the act of throwing the axe, etc.).

However, because of this, when the samurai is printed the axe will then fall out of the samurai's hand (or at least be loose).

This issue could be problematic for common elements of videogame characters that are assembled or collocated within the game world rather than originating as a single model; one example is that a videogame character's eyes are often separate to the head of the character; depending on the capture process, any gap between the face and eyes could result in the eyes being printed loose and then falling into the hollow body of the character.

Figure 21:
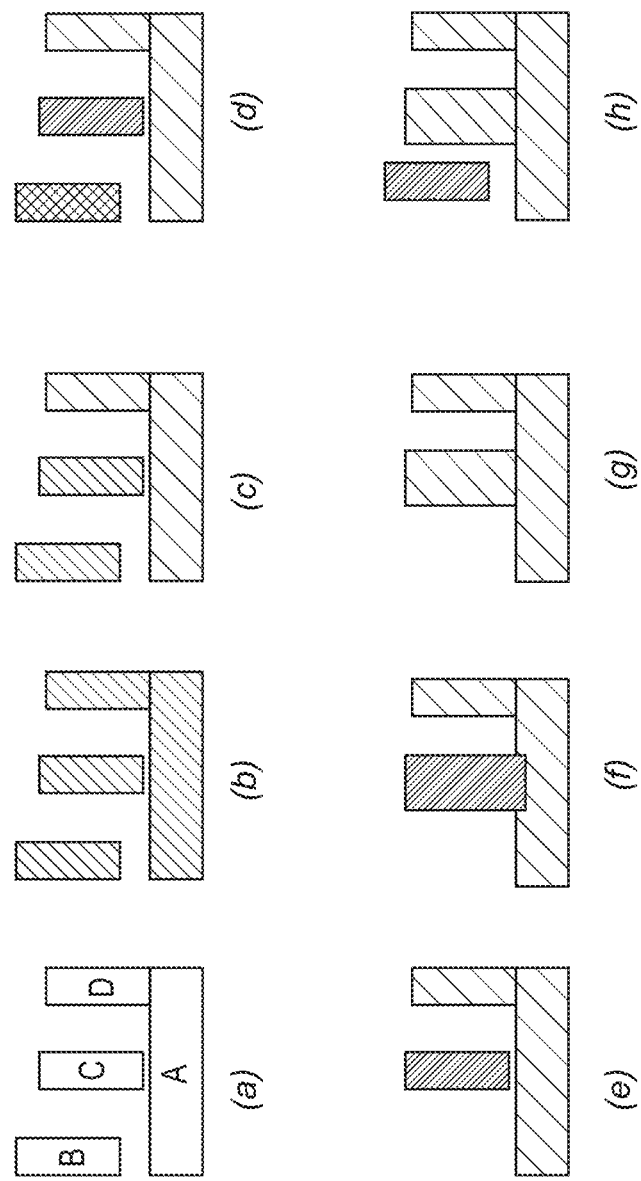
FIG. 21(*a-h*) is an illustration of modifications to an image in accordance with embodiments of the present invention.

Hence more generally, referring now to FIG. 21, in instance (a), which is a 2D slice of a model as described previously for the purposes of explanation, a character or other printable object may be the composite of several directly adjacent elements A and D, but a user may also expect them to be accompanied by an associated accessory C (or equally a further element of the character that is not in perfect alignment). Meanwhile another element of the environment B that may lie within the overall region of the character/object may nevertheless be considered separate, and either unwanted or considered a secondary printable object (e.g. a football about to be kicked by a character).

Running the flood fill algorithm as described herein result in the expected identification of three objects as shown in instance (b), being a composite of A & D, and separately C and B.

Recalling that the flood fill algorithm can be initialised at a specific leaf/point in the image (instead of from the edges), the algorithm can then be used for a separate purpose:

Having identified the enclosed regions by virtue of the first flood fill, a second flood fill can be instigated within the one of the enclosed regions (for example the largest enclosed region corresponding to A & D), using a different colour or value as an ID. The precise start point within such a region is not critical, although optionally a test may be made to ensure that it is more than N pixels away from any existing source fill target colours to ensure that the first pixel is not an anti-aliased blend of colours but is in fact representative of the region. Clearly however in the case of the volumetric models described herein, such anti-aliasing is not an issue and so this consideration is not essential.

Since parts B and C are not connected they will not be filled as shown in instance (c) of FIG. 21. It is then possible to identify pixels that have still not been filled, and apply the algorithm again with a different colour/ID until there are no pixels with the flood fill source colour/ID left and hence all the disconnected parts have been identified. As a result each of parts B and C receive their own fill in colour/ID, giving the final result shown in instance (d) of FIG. 21. At this point, is also possible to count the pixel/voxel's occupied by each ID (or tally a count already made during the filling process) to determine which is the main part, if that is relevant to any further process.

It will be appreciated the above approach also extends to the oct-tree and volumetric image version of the algorithm.

Given the full characterisation of the slice of which image created by this approach, it is then possible to identify where separate objects are within a threshold distance of each other, and apply rules to determine whether or not these should in fact be joined.

For example, a metric based upon the distance between two objects divided by the (optionally weighted) length or area that the objects are within that distance or (a predetermined threshold maximum distance) can be compared to a threshold value to determine whether or not the two objects can be joined.

In other words, where two irregularly shaped objects happen to be close to each other at an individual point, the distance between them is offset by division with the short shared length within that distance, so that in effect such objects have to be much closer to each other to trigger combining them. This also militates against joining objects by narrow and hence potentially flimsy links that may be breakable. By contrast for example if two objects are at a moderate distance apart, but run parallel to each other for a significant length (typically indicating that the objects are intended to be treated as one), then the moderate distance is divided by that length, making it more likely that the objects should be joined.

Other approaches will be apparent to the skilled person, such as for example simply setting a threshold distance between two objects within which they should be merged.

In any case it will be appreciated that optionally supplementary geometry of the kind described previously herein may then be used provide the connection and/or to thicken and strengthen the connection.

Alternatively or in addition, the smaller of the two objects may be moved to merge with the larger object, and the amount of movement may optionally be that required to merge the object until the cross-sectional area of the small object at the point of intersection reaches a threshold size deemed to provide a sufficiently strong connection. Optionally the smaller object may be subjected to a dilation or rescaling function to increase its cross-sectional area in the vicinity of the larger object. This may either directly result in the smaller object merging with larger object, or simply increase the cross-sectional area of the small object so that less movement is required to achieve a strong connection.

Similarly the smaller of the two objects may be extruded to intersect with the larger object and again optionally the extrusion may begin at a point in the small object which has a predetermined cross-sectional area deemed to provide a sufficiently strong connection.

Whilst the above has been described in relation to adjusting features of small object, clearly will be appreciated that features of the larger object in the vicinity of the smaller object may alternatively or in addition be adjusted to cause the two objects to connect.

A dilation or rescaling option is illustrated in instances (e) and (f) of FIG. 21, in this case as a result the whole object C becomes larger, and intersects with the main object with a sufficiently large cross-sectional area to form a strong link.

Optionally this point, the process of identifying bodies within the image may be rerun using the flood fill algorithm in case moving or resizing objects has caused other changes in connectivity within the overall object.

The result is a single body combining original objects A, C and D (as shown in instance (g)). Meanwhile, the more distant object B did not satisfy the distance/shared length metric, or an absolute distance metric, or any other suitable metric for merging, and so remains separate as shown in instance (h) of FIG. 21.

It will be appreciated that this approach is preferably implemented using the oct-tree and volumetric image version of the algorithm, because in practice different elements of a realistic videogame character are unlikely to be flat and parallel to each other, and so two elements in such a model may have varying distances between each other in successive cross sections. As a result, moving, resizing or extruding individual slices of a 2-D element according to the conditions specific to that slice are likely to result in inconsistent results in the model as a whole. Hence whilst constraints could be inherited between successive slices, it is considerably simpler to implement this process within a volumetric image.

It will also be appreciated that the model may be presented to a user for manual editing, possibly marked up using the fill in algorithm as described above with reference to instance (d) of FIG. 21 to identify any/each separate enclosed regions that may need attention, and with resulting changes in the model caused actions of the user being reassessed in the same manner.

Figure 22:
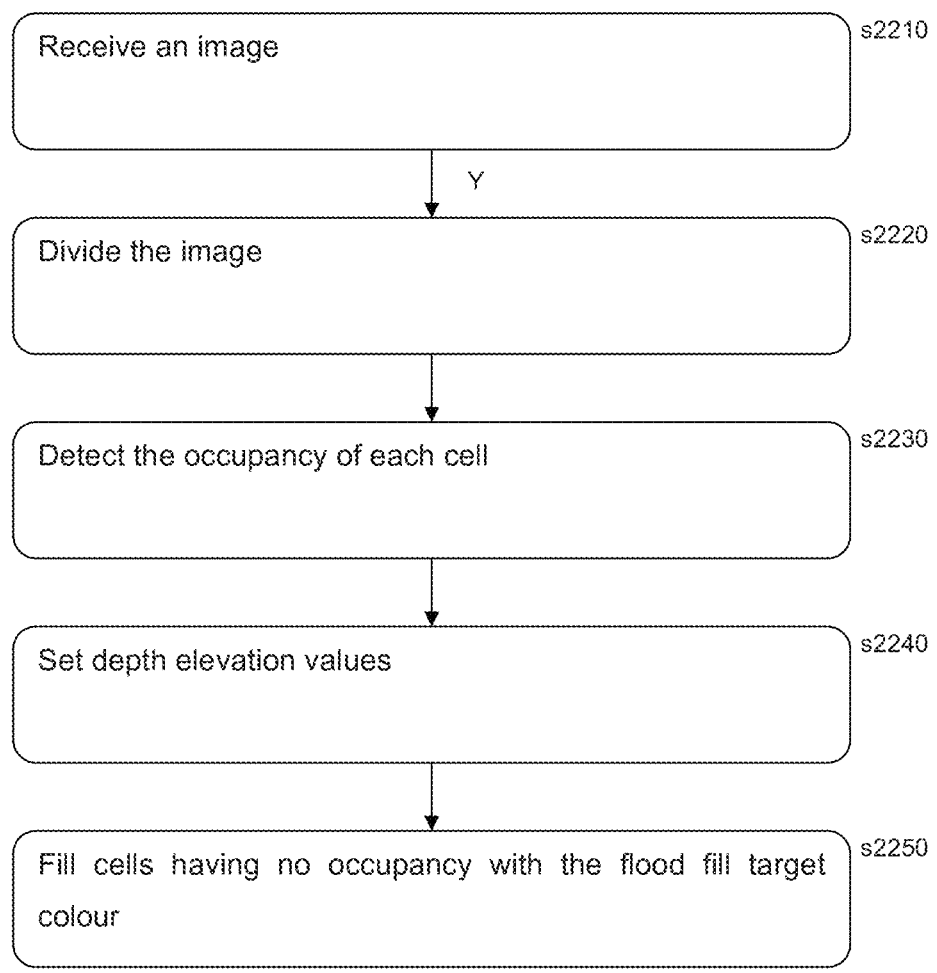
FIG. 22 is a flow diagram of a flood-fill method for parallel implementation in accordance with embodiments of the present invention

Referring now also to FIG. 22, in a summary embodiment of the present invention, a flood-fill method for parallel implementation, comprises:

In a first step s2210, receiving an image (for example a 2D slice or 3D volume image of an in-game object, optionally before, during or after other modifications have been applied as described elsewhere herein), the image comprising first elements having a flood fill source colour to be replaced with a flood fill target colour, and second elements not having the flood fill source colour (for example border pixels as described previously herein);

In a second step s2220, dividing the image according to a hierarchical space-partitioning scheme (e.g. quad-tree or oct-tree) to form cells at a plurality of levels in the hierarchy (such as those illustrated at FIG. 16);

In a third step s2230 detecting the occupancy of each cell by second elements (for example using occupy_all and occupy_some bits as described previously herein);

for any cell having no occupancy by second elements, in a fourth step s2240 set a depth elevation value for child cells of that cell to be one greater than the value for that cell, indicating that the flood fill will navigate levels towards a root cell by the depth elevation amount of a cell whilst only occupying nodes without any second elements, thereby reaching the largest parent cell which can be flood-filled (for example as described previously herein and as illustrated in FIG. 16); and In a fifth step s2250 filling the flood fill source colour of cells having no occupancy by second elements with the flood fill target colour, thereby modifying the received image.

In an instance of this summary embodiment, the image is two dimensional, the hierarchical space-partitioning scheme is a quad-tree, and the cells are rectilinear.

In an instance of this summary embodiment, the image is volumetric, the hierarchical space-partitioning scheme is an oct-tree, and the cells are cuboid.

In an instance of this summary embodiment, when processing cells, the at least one side from which a cell is entered is stored, and additional cells for processing are identified as those neighbouring cells other than the cell on the stored side from which the cell was entered.

In an instance of this summary embodiment, when processing cells the at least one side from which a cell is entered is stored, and work items are generated for the child cells adjacent to the stored at least one side.

In an instance of this summary embodiment, a work item is generated for each of a plurality of cells, and two or more respective work items are processed in parallel.

In this case, optionally the two or more respective work items are processed by a graphics processing unit.

In an instance of this summary embodiment, the image elements replaced with a flood fill target colour represent a flood fill mask.

In a version of this instance, image regions outside the flood fill mask are defined as closed regions.

In this version, optionally a distance based metric is determined for the distance between two closed regions, and if the metric is less than a predetermined threshold amount, then at least one of the two regions is modified by one or more modifications in the list consisting of moving at least one of the two regions until the two regions intersect; and increasing the size of at least part of at least one of the two regions until the two regions intersect.

Optionally the flood-fill algorithm may then be repeated if at least one of the two regions is modified.

In this version, the image may represent some or all of an object to be 3D printed.

Optionally, the image may then be modified by adding a hole, formed of one or more elements having the flood fill target colour, to a region of the image identified as a closed region. This may be done to create a drainage how for 3D print material that may otherwise become trapped within an enclosed region (see the 'Waste Materials' section later herein). Optionally adding a hole may be conditional on the closed region being greater than a threshold size or volume. The hole may be of a fixed length (for example equal to or longer then a known shell thickness) or may extend by replacing a predetermined width of pixels (e.g. border pixels) with the flood fill target colour until the width of pixels is detected to comprise flood-fill source colour, indicating that the 'wall' of the enclosed region has been breached.

If the image represents some or all of an object to be 3D printed, then optionally the method may then comprise the steps of generating 3D printing instructions responsive to the flood-filled image; and outputting those 3D printing instructions for a 3D printer.

Object Selection

The above discussion has assumed that a target object(s) has been selected from a region of the virtual environment; for example, the user may select to just print their avatar, or their avatar and an opponent.

This selection may be done for example by a user interface for defining a bounding box around the desired object(s), or by a user interface for indicating specific objects within the game environment using a cursor or reticule.

Where the object(s) are selected in this manner in isolation from a supporting surface, a default surface such as a flat panel may be generated having an area responsive to the size of the selected object(s). The selected object(s) can then be coupled to the support surface using the techniques described herein.

Editing Once the printer geometry has been obtained using the above techniques as applicable, then optionally they may be transferred to an editing application for the user to preview or modify the model before sending it to the printer. For example it may be desired to review the model for possible errors, and/or to edit the pose and positioning of certain key characters. The editor may likewise enable the addition of decals, either purely to painted textures, or to the surface structure of objects for example by deleting surface voxels so that the user can effectively engrave messages into a surface of the model.

Final Print

Once the user is satisfied with their 3D model, it may be sent to the printer. As described previously, a printer driver analyses the model and divides it into layers of voxels for successive printing.

Where the printer is a domestic device either physically attached to the console or sharing a home network, then the printer driver may be implemented on the entertainment device, and the resulting drawing list is sent to the printer by the entertainment device.

However optionally a printing service may be provided by the entertainment device's network (that is to say, a network provided for example by the manufacturers of the entertainment device). This may allow access to a more expensive and sophisticated 3D printer than the average consumer could afford, and consequently a better quality model. In these circumstances either the printer driver may still be on the console, to distribute processing load among users, or may be at a central server connected to the 3D printer. In the first instance local printer drivers will generate drawing lists that may be sent securely to a central print queue server, together with meta data relating to the postal address of the user. In the second instance the entertainment device securely sends the 3D model printer geometry to a central printer driver that performs the relevant analysis to generate the required drawing lists before queueing them for printing. In either of these cases, printing of the model may be contingent upon the payment of a fee, for example via a payment card registered with the entertainment device's network, or similarly may be contingent upon the receipt of a voucher which might be earned for example as a trophy or other in-game award, or as part of the purchase price of a game, entitling the user to the creation of a predetermined number of 3D models from that game.

Hence a step of 3D printing a model based upon the output 3D printable model data directly results in a 3D printed model.

Waste Materials

It will be appreciated that 3D Printing techniques such as selective laser sintering can trap large quantities of the raw printer material inside the resulting model. This is because such techniques apply successive layers of powder across the top of the model during printing, fusing only a small proportion corresponding to the model's periphery but leaving the remaining powder inside that periphery untouched. The overall result is a volume of powder within which is a fused shell, with the powder outside that shell being removable, whilst the powder inside the shell is trapped.

This creates unnecessary costs in terms of wasted raw materials. It can also affect the balance of the resulting objects. Consequently it is commonplace to include vents or openings in models designed for 3D Printing to allow the waste powder to be poured or washed out.

However, such vents or openings are not present in videogame characters and are not desirable.

Accordingly, in an embodiment of the present invention, if a powder-based printer is to be used, a procedural rule is implemented to calculate the effective volume of space within objects in the printed scene. Where that volume exceeds a threshold amount, the object is treated as a hollow body and a procedural rule creates an opening in the voxel shell of the hollow body of a size that allows printer powder to flow out. Preferably, the opening is located on the underside of the hollow body and/or on a side facing away from the original viewpoint displayed on screen to the user when they indicated that they wanted to print the scene. The opening may be a hole in the voxel shell, or preferably an annular gap forming a ring or some other shape of closed loop. In the case of an annular gap, this results in a loose cover in the printed body that can be removed to allow the powder out, but which can then by adhered back onto the model, minimising the aesthetic impact of removing the powder on the finished object.

It will be appreciated that a 3D printed scene may comprise multiple such hollow bodies. For example, the scene may comprise the ground, a character such as Blob-man, and a tree. The ground is typically an open shell. Meanwhile the tree rests upon it, with the ground forming the base of the tree. Following calculations of the volume within the model, the tree trunk may be identified as a hollow object. Accordingly, a hole may be created in the ground beneath the tree, visible only if the model is viewed from the underside. By contrast, the Blobman character is supported by connecting rods above the ground. Consequently if the character torso is identified as a hollow object, an annular gap is included facing away from the original viewpoint, optionally at a position a threshold distance from any connecting rod. This allows the torso to be drained of powder but also to be repaired by affixing back in place the removable component of the torso created by the annular gap.

Optionally, the procedural rule may use features of the object itself to reduce the aesthetic impact of the hole or annular gap, for example by setting some or all of one or more edges of the hole or gap to follow adjacent a boundary between texture colours in a model, and/or to follow adjacent a ridge or other discontinuity in the model surface.

The system may use the 3D model data to estimate the volume of printer raw material needed, and provide a quote estimating the cost of printing the model before the user commits to doing so.

Finally, referring back to FIG. 1, it will be appreciated that an apparatus or system of apparatuses could implement the above summary embodiment of the method or the variant instances, versions and options, and more generally the flood fill technique described herein.

Hence for example, in another summary embodiment, an entertainment device (such as the PlayStation 4® 10 comprises a flood-fill processor (such as GPU 20B operating under suitable software instruction), adapted in operation to receive an image comprising first elements having a flood fill source colour to be replaced with a flood fill target colour, and second elements not having the flood fill source colour, divide the image according to a hierarchical space-partitioning scheme to form cells at a plurality of levels in the hierarchy, detect the occupancy of each cell by second elements, for any cell having no occupancy by second elements, set a depth elevation value for child cells of that cell to be one greater than the value for that cell, indicating that the flood fill shall navigate levels towards a root cell by the depth elevation amount whilst only occupying nodes without any second elements, thereby reaching the largest parent cell which can be flood-filled and fill the flood fill source colour of cells having no occupancy by second elements with the flood fill target colour, thereby modifying the received image.

Hence a general purpose computer operating under suitable software instruction can implement the previously described method of flood-filling.

The additional methods and techniques described herein may also be implemented by the device 10 operating under suitable software instruction, and the 3D printing itself may be implemented by the device operating in conjunction with a 3D printer 100.

It will be appreciated from the above description that the methods described herein may be carried out on conventional hardware suitably adapted as applicable by software instruction or by the inclusion or substitution of dedicated hardware.

Thus the required adaptation to existing parts of a conventional equivalent device may be implemented in the form of a computer program product comprising processor implementable instructions stored on a non-transitory machine-readable medium such as a floppy disk, optical disk, hard disk, PROM, RAM, flash memory or any combination of these or other storage media, or realised in hardware as an ASIC (application specific integrated circuit) or an FPGA (field programmable gate array) or other configurable circuit suitable to use in adapting the conventional equivalent device. Separately, such a computer program may be transmitted via data signals on a network such as an Ethernet, a wireless network, the Internet, or any combination of these or other networks.

The foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A flood-fill method for parallel implementation, comprising the steps of:
    receiving an image comprising first elements having a flood fill source colour to be replaced with a flood fill target colour, and second elements not having the flood fill source colour;
    dividing the image into a hierarchy according to a hierarchical space-partitioning scheme to form cells at a plurality of levels in the hierarchy, each of the plurality of levels having cells of a respective size, from a smallest size at a lowest level in the hierarchy to a largest size at a highest level in the hierarchy;
    detecting occupancy of each cell by the second elements;
    setting a respective depth evaluation value for any child cells of each parent cell having no occupancy by the second elements, the depth elevation value for such child cells being one greater than the depth evaluation value for such parent cell, indicating that the flood fill shall navigate levels towards a root cell by the depth elevation amount whilst only occupying cells having no occupancy by the second elements, thereby reaching a largest parent cell having no occupancy by the second elements and thereby being available to be flood-filled; and
    filling the flood fill source colour of the largest parent cell having no occupancy by the second elements with the flood fill target colour, thereby modifying the received image.

2. The method of claim 1, in which the image is two dimensional, the hierarchical space-partitioning scheme is a quad-tree, and the cells are rectilinear.

3. The method of claim 1, in which the image is volumetric, the hierarchical space-partitioning scheme is an oct-tree, and the cells are cuboid.

4. The method of claim 1, in which, when processing cells, an at least one side from which a given cell is entered is stored, and additional cells for processing are identified as those neighbouring cells other than the given cell on the stored at least one side from which the given cell was entered.

5. The method of claim 1, in which, when processing cells, an at least one side from which a given cell is entered is stored, and work items are generated for the child cells adjacent to the stored at least one side.

6. The method of claim 1, in which a work item is generated for each of a plurality of the cells, and two or more respective work items are processed in parallel.

7. The method of claim 6, in which the two or more respective work items are processed by a graphics processing unit.

8. The method claim 1, in which the image elements replaced with a flood fill target colour represent a flood fill mask.

9. The method of claim 8, in which image regions outside the flood fill mask are defined as closed regions.

10. The method of claim 9, in which a distance based metric is determined for the distance between two closed regions, and if the metric is less than a predetermined threshold amount, then at least one of the two regions is modified by one or more modifications in the list consisting of:
   i. moving at least one of the two regions until the two regions intersect; and
   ii. increasing the size of at least part of at least one of the two regions until the two regions intersect.

11. The method of claim 10, in which the flood-fill algorithm is repeated if at least one of the two regions is modified.

12. The method of claim 9, in which the image represents some or all of an object to be 3D printed.

13. The method of claim 12, comprising the step of: modifying the image by adding a hole, formed of one or more elements having the flood fill target colour, to a region of the image identified as a closed region.

14. The method of claim 12, comprising the steps of
   generating 3D printing instructions responsive to the flood-filled image; and
   outputting those 3D printing instructions for a 3D printer.

15. A non-transitory, computer-readable storage medium containing a computer program that, when run by a computer, causes the computer to carry out actions of a flood-fill method for parallel implementation, the actions comprising:
   receiving an image comprising first elements having a flood fill source colour to be replaced with a flood fill target colour, and second elements not having the flood fill source colour;
   dividing the image into a hierarchy according to a hierarchical space-partitioning scheme to form cells at a plurality of levels in the hierarchy, each of the plurality of levels having cells of a respective size, from a smallest size at a lowest level in the hierarchy to a largest size at a highest level in the hierarchy;
   detecting occupancy of each cell by the second elements;
   setting a respective depth evaluation value for any child cells of each parent cell having no occupancy by the second elements, the depth elevation value for such child cells being one greater than the depth evaluation value for such parent cell, indicating that the flood fill shall navigate levels towards a root cell by the depth elevation amount whilst only occupying cells having no occupancy by the second elements, thereby reaching a largest parent cell having no occupancy by the second elements and thereby being available to be flood-filled; and
   filling the flood fill source colour of the largest parent cell having no occupancy by the second elements with the flood fill target colour, thereby modifying the received image.

16. An entertainment device, comprising:
a flood-fill processor, adapted in operation to:
receive an image comprising first elements having a flood fill source colour to be replaced with a flood fill target colour, and second elements not having the flood fill source colour;
divide the image into a hierarchy according to a hierarchical space-partitioning scheme to form cells at a plurality of levels in the hierarchy, each of the plurality of levels having cells of a respective size, from a smallest size at a lowest level in the hierarchy to a largest size at a highest level in the hierarchy;
detect occupancy of each cell by the second elements;
set a respective depth evaluation value for any child cells of each parent cell having no occupancy by the second elements, the depth elevation value for such child cells being one greater than the depth evaluation value for such parent cell, indicating that the flood fill shall navigate levels towards a root cell by the depth elevation amount whilst only occupying cells having no occupancy by the second elements, thereby reaching a largest parent cell having no occupancy by the second elements and thereby being available to be flood-filled; and
fill the flood fill source colour of the largest parent cell having no occupancy by the second elements with the flood fill target colour, thereby modifying the received image.

* * * * *